(12) United States Patent
Shiramizu et al.

(10) Patent No.: US 8,121,579 B2
(45) Date of Patent: Feb. 21, 2012

(54) ACTIVE MIXER CIRCUIT AND A RECEIVER CIRCUIT OR A MILLIMETER-WAVE COMMUNICATION UNIT USING IT

(75) Inventors: Nobuhiro Shiramizu, Musashino (JP); Toru Masuda, Kokubunji (JP); Takahiro Nakamura, Kodaira (JP); Katsuyoshi Washio, Tokorozawa (JP); Masamichi Tanabe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 445 days.

(21) Appl. No.: 12/370,159

(22) Filed: Feb. 12, 2009

(65) Prior Publication Data

US 2009/0221259 A1 Sep. 3, 2009

(30) Foreign Application Priority Data

Feb. 28, 2008 (JP) ................. 2008-047723

(51) Int. Cl.
  *H04B 1/16* (2006.01)
  *H04B 1/26* (2006.01)
  *H03D 7/16* (2006.01)
(52) U.S. Cl. .................. 455/334; 455/131; 455/323
(58) Field of Classification Search .......... 455/334, 455/131, 313, 323, 333
  See application file for complete search history.

(56) References Cited

U.S. PATENT DOCUMENTS

| | | | |
|---|---|---|---|
| 6,381,449 B1 | 4/2002 | Yamaji et al. | |
| 6,711,395 B1 * | 3/2004 | Tonegawa et al. | 455/313 |
| 6,973,328 B1 | 12/2005 | Suematsu | |
| 7,263,343 B2 | 8/2007 | Mitsunaka et al. | |
| 7,336,940 B2 * | 2/2008 | Smithson | 455/326 |

FOREIGN PATENT DOCUMENTS

| | | |
|---|---|---|
| JP | 10-224152 A | 8/1998 |
| JP | 2000-101353 A | 4/2000 |
| JP | 2000-349660 A | 12/2000 |
| JP | 2003-163601 A | 6/2003 |
| JP | 2004-165793 A | 6/2004 |
| JP | 2004-357091 | 12/2004 |
| JP | 2005-102140 A | 4/2005 |
| JP | 2006-074341 A | 3/2006 |
| JP | 2006074341 A * | 3/2006 |

OTHER PUBLICATIONS

John R. Long et al, "A 1.9 GHz Low-Voltage Silicon Bipolar Receiver Front-End for Wireless Personal Communications Systems", IEEE Journal of Solid-State Circuits, vol. 30, No. 12, pp. 1438-1448, Dec. 1995.

Ty Yoon et al, "Front-End CMOS Chipset for Fiber-Based Gigabit Ethernet", 1998 Symposium on VLSI Circuits Digest of Technical Papers, pp. 188-191, 1998.

* cited by examiner

*Primary Examiner* — James H Cho
(74) *Attorney, Agent, or Firm* — Miles & Stockbridge P.C.

(57) ABSTRACT

The present invention provides a semiconductor integrated circuit including an active mixer circuit that is operated at low voltage, low noise, and low power consumption. It includes a transconductance amplifier, a transformer, and a multiplier, connects a transformer between the transconductance amplifier and the multiplier, and separates between the transconductance amplifier and the multiplier with respect to direct current inside the transformer. Further, each of the tranconductance amplifier and the multiplier is configured of transistors that are single-stacked between the supply voltage terminal and ground terminal.

20 Claims, 14 Drawing Sheets

ACTIVE MIXER CIRCUIT AND A RECEIVER CIRCUIT OR A MILLIMETER-WAVE COMMUNICATION UNIT USING IT

CLAIM OF PRIORITY

The present application claims priority from Japanese Patent Application JP 2008-047723 filed on Feb. 28, 2008, the content of which is hereby incorporated by reference into this application.

FIELD OF THE INVENTION

The present invention relates to a mixer circuit that is mounted on a receiver for wireless communication or wired communication and performs frequency conversion, and more particularly, to a technology useful for providing an active mixer circuit having a low supply voltage and a receiver circuit or a millimeter-wave communication unit using it.

BACKGROUND OF THE INVENTION

As an example of a mixer circuit according to the conventional art, JP-A-2004-357091 discloses a Gilbert cell type double balanced mixer circuit shown in FIG. 16 (see FIG. 10 of JP-A-2004-357091). In the Gilbert cell type double balanced mixer circuit, one differential amplification transistor pair MB and MC is connected in series to a circuit where two differential switch transistor pairs MD and ME and MF and MG are cross-connected. Herein, the MA is a current source transistor for bias. Loads 111 and 112 are connected to a supply voltage VDD. A differential radio frequency signal RF inputs RF+ and RF− is amplified by a differential amplification transistor pair and an output of the amplified differential radio frequency signal and a frequency signal LO input from a local oscillator mounted on a receiver are multiplied by the differential switch transistor pair, such that a differential intermediate frequency signal IF (IF+ and IF−) is output and amplified to be an output signal having an amplitude larger than that of an input signal.

John R. Long et al, "A 1.9 GHz Low-Voltage Silicon Bipolar Receiver Front-End for Wireless Personal Communications Systems", IEEE Journal of Solid-State circuits, Vol. 30, No. 12, pp. 1438-1448, December 1995, discloses a mixer circuit that includes a single-to-differential converter using a transformer T1 as shown in FIG. 17 (see FIG. 9 of John R. Long et al). A radio frequency signal $RF_{in}$ is single-to-differential converted by the transformer T1 and is frequency-converted via differential switch transistor pairs Q1 and Q2 and Q3 and Q4, such that intermediate frequency signals IF+ and IF− are output. Q5 is a current source transistor for bias. The single-to-differential conversion can be performed by this configuration. Q6 and Q7 are a Darlington buffer.

Further, JP-A-2004-357091 discloses a mixer circuit using a wideband balun shown in FIG. 18 (see FIG. 2 of JP-A-2004-357091) in order to solve problems of the mixer circuit in the conventional art shown in FIG. 16. The mixer circuit includes a low-noise amplifier LNA 121 that includes an amplifier stage transistor M1, a cascode stage transistor M2, and a load 124 and amplifies an RF signal (radio frequency signal), a balun 122 that converts an RF signal (single end signal) from the LNA 121 into a differential signal, and a switch circuit 123 that mixes a differential signal from the balun with a local originating signal LO. The RF signal (radio frequency signal) is supplied to the gate of the amplifier stage transistor M1 together with a bias voltage supplied through a resistor 125.

SUMMARY OF THE INVENTION

A mixer circuit, which is a circuit block that performs frequency conversion from a predetermined high frequency for wireless communication to a low frequency for demodulating a modulation signal modulated into a radio frequency signal in a receiver chain of a wireless communication system, needs to perform the frequency conversion with noise as low as possible and conversion gain as large as possible. Herein, the conversion gain is a ratio of signal amplitude of a radio frequency input to the mixer circuit to signal amplitude of an output frequency output from the mixer circuit. The higher the conversion gain is, the more the output signal amplitude with respect to the same input signal amplitude increases. The mixer circuit, which attenuates the signal amplitude having the conversion gain smaller than 1, is referred to as a passive mixer circuit, while the mixer circuit, which amplifies the signal amplitude having the conversion gain larger than 1, is referred to as an active mixer circuit. If properly designed, the active mixer circuit can improve signal-to-noise ratio (S/N ratio) to decrease deterioration of noise as compared to the passive mixer circuit, thus improving reception sensitivity of the receiver. As a result, the active mixer circuit is mainly used for wireless communication devices. Further, in the mixer circuit, there is a need to reduce the frequency signal that is included in the output signal but is not required for demodulation.

A Gilbert cell type mixer circuit shown in FIG. 16, which is the mixer circuit in the conventional art, has a configuration that stacks transistors in three stages; however, there is a problem in that the supply voltage should be high in order to sufficiently secure an operating voltage of the transistor. In other words, in the circuit shown in FIG. 16, since the transistors are connected between the supply voltage VDD and a ground terminal in a three-stage series, voltage at least three times as large as voltage required for operating one transistor is needed so that each transistor can be operated. A proper operating voltage that sums a collector-emitter voltage VCE of a bipolar transistor or a drain-source voltage VDS of a field-effect transistor can be realized by using current technology. Thus, if a margin of voltage drops due to load elements, which is generally about 1 V, when the transistors are connected in three-stage series, at least 3 V is needed.

Even though the transistors can be operated as the mixer circuit by removing the transistor MA of FIG. 16, grounding each source of the transistor pair MB and MC, and supplying a proper bias voltage to each gate of the MB and MC, even in the case above, requires at least 2 V. Further, when the transistors are operated to reduce the operating voltage for the transistors of the mixer circuit to 1 V or less, since parasitic capacitance of the collector-emitter of the transistor or the drain-source of the transistor is drastically increased, a high frequency signal from several GHz to several tens GHz, which is used for wireless communication, cannot be generated.

Further, when the double balanced mixer circuit suppresses and outputs the input local oscillator frequency signal, this is advantageous in that signal components that are included in the output signal are reduced but not required for demodulation, while the input single-ended signal into the differential signal needed to be previously converted. In the case of the receiver for wireless communication, since the input signal is a weak single-ended signal such that it can be received through an antenna, the insertion of the single-to-differential converter causes the decrease of the S/N ratio because of the decrease of the amplitude and the increase of the noise.

On the other hand, the mixer circuit including the single-to-differential converter using the transformer shown in FIG. 17 has a configuration that stacks transistors in two-stages, while reducing the supply voltage required for driving as compared to the Gilbert cell type mixer circuit. However, the circuit is not configured to provide the differential amplification transistor pair, thus it cannot perform amplification through the frequency conversion. The signal input to RFin passes through the transformer T1, such that the amplitude of the signal is attenuated and the noise thereof is increased. For this reason, the decrease of the S/N ratio can not be avoided.

On the other hand, JP-A-2004-357091 discloses the mixer circuit using the wideband balun 122 shown in FIG. 18. In the circuit configuration, the voltage amplitude is previously amplified by the low-noise amplifier and is single-to-differential converted by the balun; the contribution of the noise generated by passing through the balun becomes small. For this reason, the decrease of the S/N ratio can be suppressed to be small.

However, although the circuit configuration shown in FIG. 18 can improve the S/N ratio, the low-noise amplifier 121, which performs the voltage amplification, is connected to a pre-stage of the balun 122. In order to increase the gain, the supply voltage required for the low-noise amplifier approximately corresponds to the voltage required for the transistor having two-stages. Further, unlike the Gilbert cell type mixer circuit in the conventional art, the circuit configuration shown in FIG. 18 requires current for operating the low-noise amplifier 121 and current for operating the switch circuit (a multiplier) 123, respectively, which results in the increase of power consumption, including power consumed in the low-noise amplifier and the multiplier.

The present invention proposes to review the problems of the conventional art and to solve the problems.

Therefore, it is an object of the present invention to provide a mixer circuit that is configured of semiconductor integrated circuits that are operated at low voltage, low noise, and low power consumption.

The foregoing objects and features and other objects and novel features of the present invention will be apparent from the description of the present specification and the accompanying drawings.

A representative one of the inventions disclosed in the present specification will be briefly described below. In other words, an active mixer circuit according to the present invention comprising a voltage-to-current converter; a multiplier; and a transformer connected between the voltage-to-current converter and the multiplier, wherein the voltage-to-current converter is configured of one transistor or plural transistors connected in parallel, wherein the transformer includes primary winding and secondary winding, wherein the voltage-to-current converter is connected in series between a pair of terminals of a reference voltage that supply the supply voltage to the transformer via the primary winding of the transformer, wherein an output terminal of the secondary winding of the transformer is connected to the multiplier, wherein the primary winding and the secondary winding of the transformer are separated from each other with respect to direct current inside the transformer, and wherein the active mixer circuit amplifies the amplitude of the input signal having conversion gain larger than 1.

Effects obtained by a representative one of the inventions disclosed in the present specification will be briefly described below. In other words, the semiconductor integrated circuits including the active mixer circuit that requires a low supply voltage for operation can be provided. Further, the semiconductor integrated circuits including the active mixer circuit that is operated at high frequency, low noise, and low power consumption can be provided.

DETAILED DESCRIPTION OF THE PREFERRED EMBODIMENTS

Figure 1:
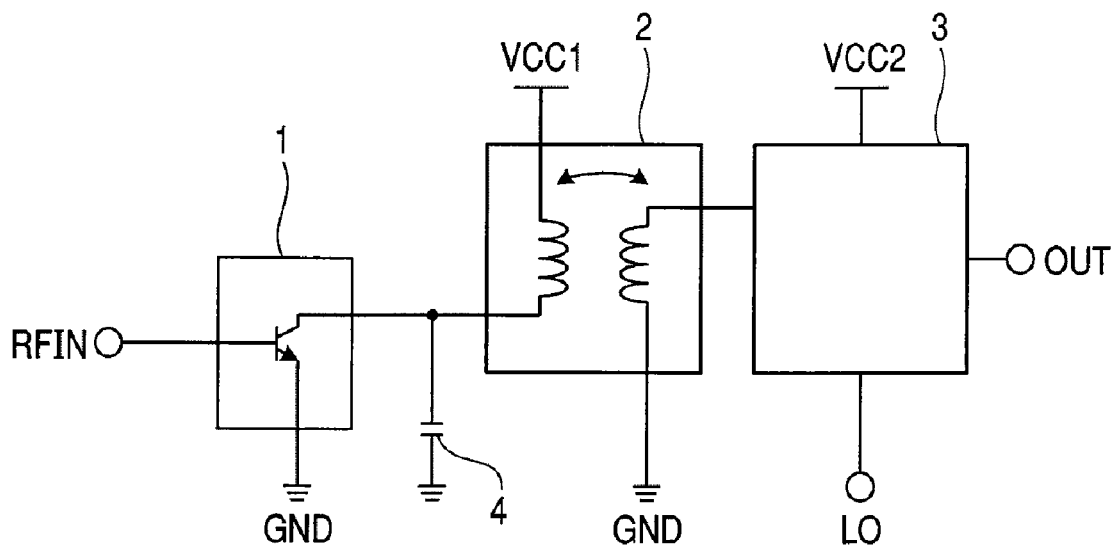
FIG. 1 is a diagram showing a block configuration example of a mixer circuit provided in a semiconductor integrated circuit according to one embodiment of the present invention.

First, representative embodiments of the present invention disclosed in the present specification will be briefly described.

In an active mixer circuit built in a representative semiconductor integrated circuit of the present invention, a transformer is connected in series between a voltage-to-current converter and a multiplier and direct bias current required for the voltage-to-current converter and the multiplier are each separated into different paths by the transformer.

The active mixer circuit according to a representative embodiment of the present invention includes a voltage-to-current converter, a transformer, and a multiplier. An input terminal of the voltage-to-current converter is supplied with an input signal of a first frequency, a ground terminal of the voltage-to-current converter is connected to a first reference voltage GND, an output terminal of the voltage-to-current converter is connected to an input terminal of the transformer, a terminal of a reference voltage of an input signal of the transformer is connected to a second reference voltage VCC1, an output terminal of the transformer is connected to a first input terminal of the multiplier, and a terminal of a reference voltage of an output signal of the transformer is connected to a first reference voltage GND.

A second input terminal of the multiplier is supplied with an input signal of a second frequency, a supply voltage terminal of the multiplier is connected to a third reference voltage VCC2, and an output signal of a third frequency is output from an output terminal of the multiplier, wherein the third frequency is the difference between the first frequency and the second frequency. Further, the terminal of the reference voltage of the input signal of the transformer and the reference terminal of the output signal of the transformer is separated from each other with respect to direct current inside the transformer.

An active mixer circuit according to another representative embodiment of the present invention includes plural groups of transistors that are connected in parallel between an output terminal of a secondary winding of a transformer and a reference voltage, that is, connected in parallel to one stage in a height direction of supply voltage, even in a transistor configuring a voltage-to-current converter as well as a transistor configuring a multiplier.

Hereinafter, the representative embodiments of the present invention disclosed in the present specification will be described in detail. Reference numerals of the reference drawings illustrate, by way of example only, but are not limited by thereto by the components shown in the drawings.

First Embodiment

First, an active mixer circuit according to a first embodiment of the present invention will be described.

FIG. 1 is a diagram showing a block configuration of an active mixer circuit provided in a semiconductor integrated circuit according to one embodiment of the present invention. A transconductance amplifier 1 configuring a voltage-to-current converter receives a radio frequency signal RFIN from an input terminal RFIN, and converts voltage amplitude of the input signal into current amplitude and amplifies it. The converted input signal is input to one terminal (input terminal) of primary winding of a transformer 2. Further, supply voltage of the transconductance amplifier 1 is supplied from supply voltage VCC1 that is provided to the other terminal of the primary winding of the transformer 2, and direct bias current is supplied through the transformer 2 from the VCC1 and flows to a ground terminal of the transconductance amplifier 1.

One terminal of secondary winding of the transformer 2 is connected to an input terminal of a multiplier 3 and the other terminal of the secondary winding of the transformer 2 is ground. The radio frequency signal amplified in the transconductance amplifier 1 is transferred to the multiplier 3 through a magnetic coupling inside the transformer 2.

Herein, frequency that can most efficiently transfer the signal through the transformer 2 is the resonant frequency from parasitic capacitance or capacitance from capacitors 4, which is generated at the output terminal of the transconductance amplifier and the input terminal of the primary winding of the transformer, and inductance, which is generated at the input terminal of the primary winding of the transformer. The signal can be efficiently transferred by setting the appropriate resonant frequency by controlling each of the capacitance value and the inductance value to correspond with the radio frequency.

The multiplier 3 includes a switch transistor that turns-on/off the radio frequency signal current by a local oscillator LO signal and a load element that has a predetermined impedance so as to convert a current signal into a voltage signal and receives supply voltage VCC2. The multiplier 3 multiplies the radio frequency signal by the local oscillator signal, such that the voltage signal of the output frequency, which is the difference of the first and second frequencies, is obtained from an output terminal OUT.

A high-frequency signal approaching the resonant frequency can be efficiently transferred and the bias current of previous circuit and the bias current of the subsequent circuit can be separated, by connecting the transformer 2 as shown in FIG. 1. Therefore, each of the supply voltage VCC1 and the bias current of the transconductance amplifier 1 and the supply voltage VCC2 and the bias current of the multiplier 3 can be set independently. The number of stages of stacked transistors between the supply voltage terminal and the ground terminal of each of the transconductance amplifier 1 and the multiplier 3 can be minimized up to one stage. Further, the bias current can be minimized corresponding to each operating conditions. As a result, each of the supply voltage and the bias current of the mixer circuit 3 can be reduced.

Further, in the transformer 2, all the primary and secondary windings may be any one of a single-ended or a differential. Further, the supply voltages VCC1 and VCC2 may be any one of having a different voltage or the same voltage. Accordingly, in the case of the same voltage, a node of VCC1 and a node of VCC2 may be commonly connected inside the mixer circuit but a path of direct current flowing in each of the transconductance amplifier 1 and the multiplier 3 should be separated.

Figure 2:
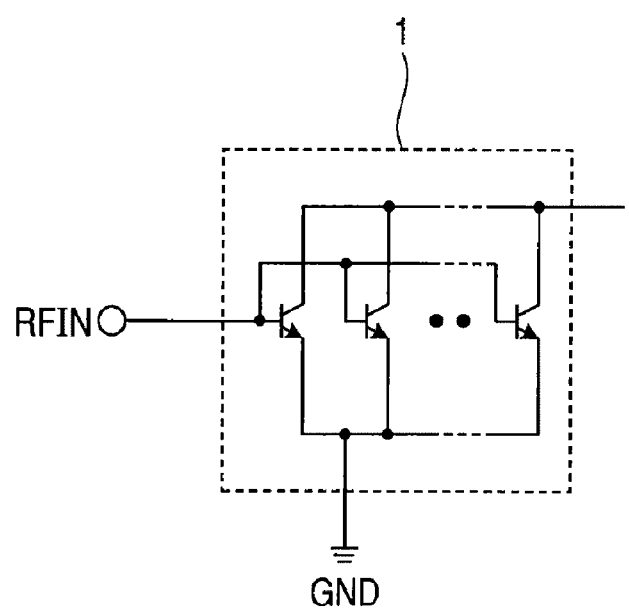
FIG. 2 is a diagram showing a configuration example of a trans-conductance amplifier that configures a voltage-to-current converter according to the present invention.

Further, in the present invention, the voltage-to-current converter 1, which is connected in series to the primary winding of the transformer, may be configured of one transistor or plural groups of transistors that are connected in parallel with respect to the input terminal of the primary winding of the transformer 2 as shown in FIG. 2. Even in the mixer circuit having the above-mentioned configuration, each of the direct bias currents required for the voltage-to-current converter 1 including the plural groups of transistors and the multiplier 3 is separated into different paths by the transformer 2.

Figure 3:
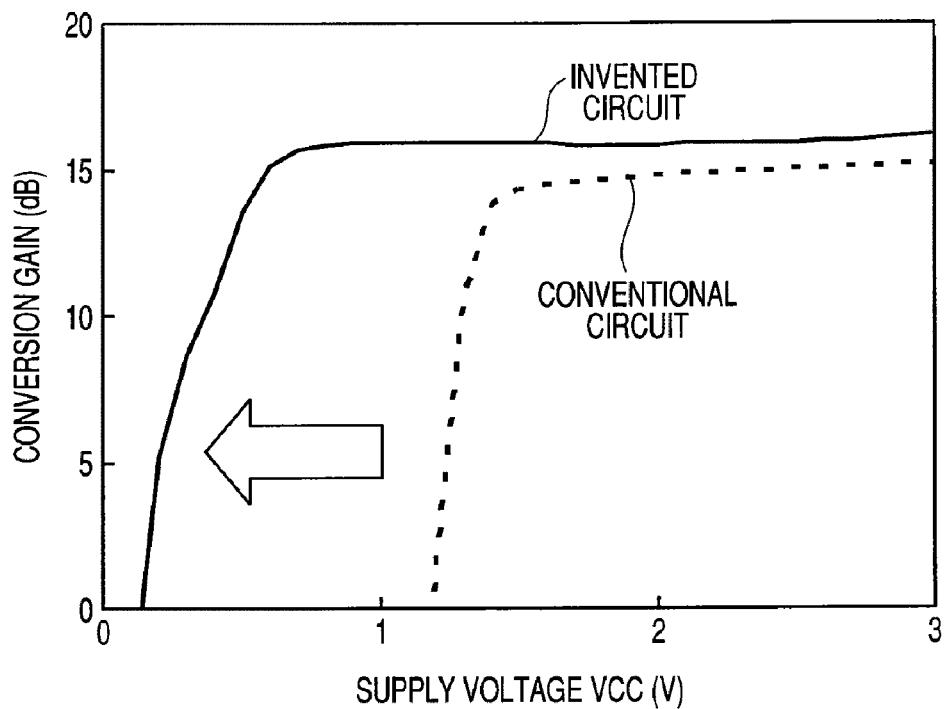
FIG. 3 is a diagram showing a relationship between a supply voltage and conversion gain in a mixer circuit according to the present invention and a mixer circuit according to the conventional art.

FIG. 3 shows a relationship between the supply voltage and conversion gain in the mixer circuit according to the present invention and the mixer circuit according to the conventional art. Since the mixer circuit according to the conventional art requires, for example, the supply voltage that corresponds to voltage or more of the transistor in two-stages, if the supply voltage is not high, it cannot obtain a desired conversion gain. To the contrary, since the mixer circuit according to the present invention, which includes the voltage-to-current converter connected in series to the primary winding of the transformer with respect to the supply voltage, needs the supply voltage that corresponds to voltage of the transistor of one-stage, it can obtain a desired conversion gain even at a relatively low supply voltage. For example, a high-speed MOS transistor, which has a low gate-source breakdown voltage of 1 V or less and a gate length less than 90 nm, can be used.

As such, with the present invention, the semiconductor integrated circuit including the mixer circuit operated at a low supply voltage can be provided. Further, the semiconductor integrated circuits including the active mixer circuit that is operated at high frequency, low noise, and low power consumption can be provided. In addition, the high-speed MOS transistor, which has the low gate-source breakdown voltage of 1 V or less and a gate length less than 90 nm, can be used by lowering the required supply voltage.

Second Embodiment

Figure 4:
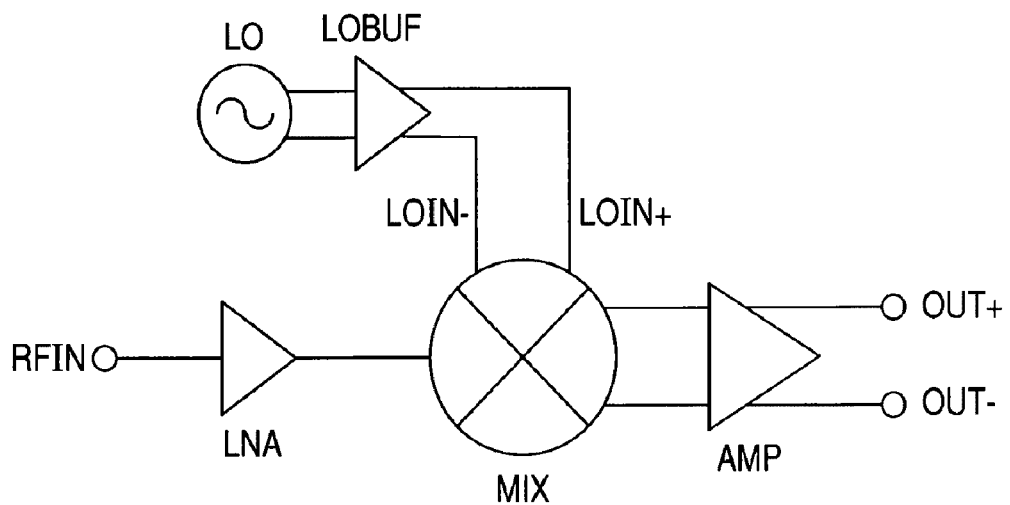
FIG. 4 is a diagram showing a block configuration example of a wireless communication receiver circuit configured by using the mixer circuit according to one embodiment of the present invention.

Hereinafter, a configuration example of a wireless communication receiver circuit as a semiconductor integrated circuit according to a second embodiment of the present invention will be described. FIG. 4 is a diagram showing a block configuration example of a wireless communication receiver circuit configured using the mixer circuit according to one embodiment of the present invention.

In FIG. 4, the wireless communication receiver circuit includes a low-noise amplifier LNA, a mixer circuit MIX, a local oscillator LO, a first differential amplifier LOBUF, and a second differential amplifier AMP. The low-noise amplifier LNA is supplied with an input signal RFIN of a first frequency that is received in an antenna of a receiver in a wireless system. An output node of the low-noise amplifier is connected to a first input node of the mixer circuit. A first output node of the local oscillator LO that oscillates and outputs a second frequency is connected to a first input node of the first differential amplifier LOBUF. Further, a second input node of the local oscillator LO is connected to a second output node of the first differential amplifier LOBUF. The first output node of the first differential amplifier LOBUF is connected to a second input node of the mixer circuit MIX. Further, the first output node of the first differential amplifier LOBUF is connected to a third input node of the mixer circuit MIX. In addition, the first output node of the mixer circuit MIX is connected to the first input node of the second differential amplifier AMP and the second output node of the mixer circuit MIX is connected to the second input node of the second differential amplifier AMP (which have a differential positive phase output terminal OUT+ and a differential negative phase output terminal OUT−), respectively.

Hereinafter, the operation of the wireless communication receiver circuit according to the present invention will be described. A radio frequency signal fRF is input to the input terminal RFIN and is amplified to a predetermined gain by the low-noise amplifier LNA. The amplified signal is input to the mixer circuit MIX. Further, a signal of a predetermined frequency fLO, which is generated by the local oscillator LO in the wireless communication receiver circuit, is amplified up to predetermined amplitude by the first differential amplifier and amplified signals of LOIN+ (a local oscillator frequency differential positive phase signal) and LOIN− (a local oscillator frequency differential negative phase signal) are input to the mixer circuit MIX. In the mixer circuit MIX, a signal of fOUT, which is the difference in the frequency between the radio frequency fRF and the local oscillator frequency fLO, is output. At this time, the output frequency fOUT has a band larger than that a modulation signal band modulated into the radio frequency fRF. The output signal fOUT is amplified and output up to predetermined amplitude via the second differential amplifier AMP and is input to a signal processing circuit that performs demodulation.

There are frequent occasions when the supply voltage of the mixer circuit MIX needs voltage higher than that of other circuits in the receiver circuit in the case of the circuit configuration in the conventional art. According to the present invention, the power consumption of the receiver circuit can be largely reduced by reducing the supply voltage required for the mixer circuit MIX. In other words, there are frequent occasions when the mixer circuit MIX generally needs supply voltage for operation higher than that of the low-noise amplifier LNA, the local oscillator LO, and the differential amplifiers LOBUF and AMP, which are other circuits in the receiver circuit. According to the present invention, the supply voltage of the entire receiver circuit can be reduced by suppressing the supply voltage of the mixer circuit MIX, such that the power consumption can be drastically reduced.

Third Embodiment

Figure 5:
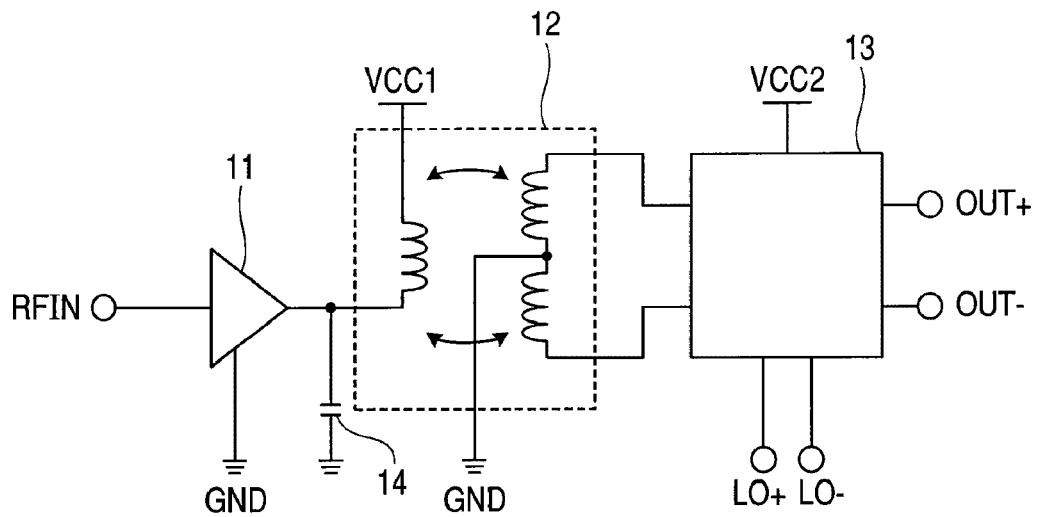
FIG. 5 is a diagram showing a block configuration example of a mixer circuit provided in a semiconductor integrated circuit according to another embodiment of the present invention.

Hereinafter, FIG. 5 is a view showing a block configuration of a mixer circuit provided in a semiconductor integrated circuit according to a third embodiment of the present invention. Unlike the embodiment of FIG. 1, the primary winding of a transformer 12 is a single-ended input and the secondary winding thereof is a differential output. One end of the primary winding is input with the single-ended signal and the other end thereof is connected to supply voltage VCC1. One end of the secondary winding of the transformer 12 outputs a differential positive phase signal, the other end thereof outputs a differential negative phase signals, and an intermediate node thereof is ground.

In other words, the transformer 12 includes the primary winding and the secondary winding having the intermediate node, wherein one end (first node) of the primary winding is connected to the input terminal of the single-ended signal of the transformer and the other end (second node) of the primary winding is connected to the terminal of the reference voltage VCC1 of the single-ended input signal of the transformer. Further, one end (first node) of the secondary winding of the transformer 12 is connected to the output terminal of the differential positive phase signal of the transformer, the other end (second node) of the secondary winding is connected to the output terminal of the differential negative phase signal of the transformer, and the intermediate node (third node) of the secondary winding is connected to the terminal of the reference voltage GND of the differential output signal of the transformer. The signal, which is converted from the single-ended signal input to the input terminal of the transformer 12 to the different signal, is output from the differential output terminal of the transformer and the terminal of the reference voltage VCC1 of the input signal of the transformer and the terminal of the reference voltage GND of the output signal of the transformer are separated from each other with respect to direct current inside the transformer. Numeral 14 shows a combined parasitic capacitance of the transistor in the transconductance amplifier 11 and the transformer 12.

By the above-mentioned configuration, the single-ended differential conversion can be performed by the transformer 12. A signal amplified by a transconductance amplifier 11 is input to the transformer 12, such that the effect of the increase in noise due to the single-ended differential conversion can be reduced. Further, the transformer is configured in a concentric circle so that each of the primary winding and the positive phase side of the secondary winding and the primary winding and the negative phase side of the secondary winding is magnetically coupled to each other, which causes the coupling to be stronger than the transformer of the single-ended input and the single-ended output having the same size. Meanwhile, local oscillator signals (Lo+ and LO−) input from the LO is offset in the inside and the amplitude of the output local oscillator frequency component is small by making an internal circuit of a multiplier 13 in a differential configuration.

As a result, according to the third embodiment, the distortion of the output signal is reduced and the power efficiency of the mixer circuit is improved.

Fourth Embodiment

Figure 6:
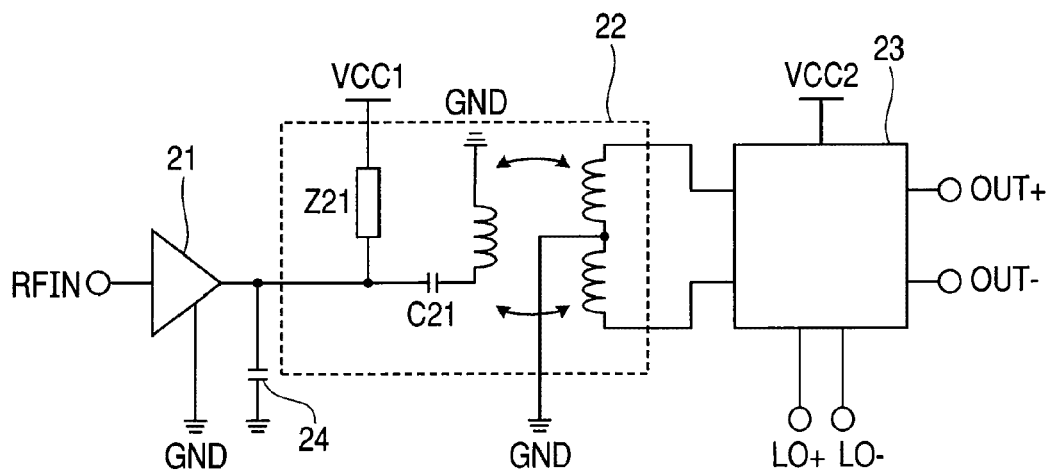
FIG. 6 is a diagram showing a block configuration example of a mixer circuit provided in a semiconductor integrated circuit according to still another embodiment of the present invention.

FIG. 6 is a diagram showing a block configuration of a mixer circuit provided in a semiconductor integrated circuit according to a fourth embodiment of the present invention. Unlike the embodiment of FIG. 1, an input terminal of primary winding of a transformer 22 is connected to a load element Z21 and a capacitor C21.

In other words, the transformer 22 includes a primary winding, a secondary winding having an intermediate node, a load element Z21, and a capacitor C21. A first node of the capacitor C21 is connected to a first node of the primary winding (end) and both of a second node of the capacitor and a first node of the load element Z21 are connected to the input terminal of the single-ended signal. A second node of the load element is connected to the terminal of the reference voltage VCC1 of the single-ended input signal of the transformer and the second node (end) of the primary winding is connected to the terminal of the reference voltage GND of the differential output signal of the transformer. On the other hand, the first node of the secondary winding (end) of the transformer 22 is connected to the differential positive phase output terminal of the transformer, the second node of the secondary winding (end) is connected to the differential negative phase output terminal of the transformer, and the intermediate node of the secondary winding is connected to the terminal of the reference voltage GND of the differential signal of the transformer.

A signal, which is converted from the single-ended signal input to the single-ended signal input terminal RFIN of the transformer 22 to the differential signal, is output from the differential output terminal of the transformer and the terminal of the reference voltage VCC1 of the input signal of the transformer and the terminal of the reference voltage GND of the output signal of the transformer is separated from each other with respect to direct current inside the transformer. Numeral 24 shows a combined parasitic capacitance of the transistor in the transconductance amplifier 21 and the transformer 22.

By the above-mentioned configuration, since the voltage gain is generated by the transconductance amplifier 21 and the load element Z21, the voltage amplitude input to the transformer 22 can be increased.

According to the fourth embodiment, in the case where the mixer is operated at a radio frequency that is different from a resonant frequency of the transformer or at a wideband, the conversion gain of the mixer can be obtained. The direct current signals can be separated and the number of voltages connected to the transformer can be reduced by connecting the capacitor C21 to the primary winding in series and in the semiconductor integrated circuit, the transformer having larger area than other transistors or resistor elements can be easily arranged. Further, when one node of the primary winding of the transformer can be connected to the VCC1 as shown in FIG. 5, the capacitor C21 is not needed.

Fifth Embodiment

Hereinafter, a fifth embodiment of the present invention will be described in detail.

Figure 7:
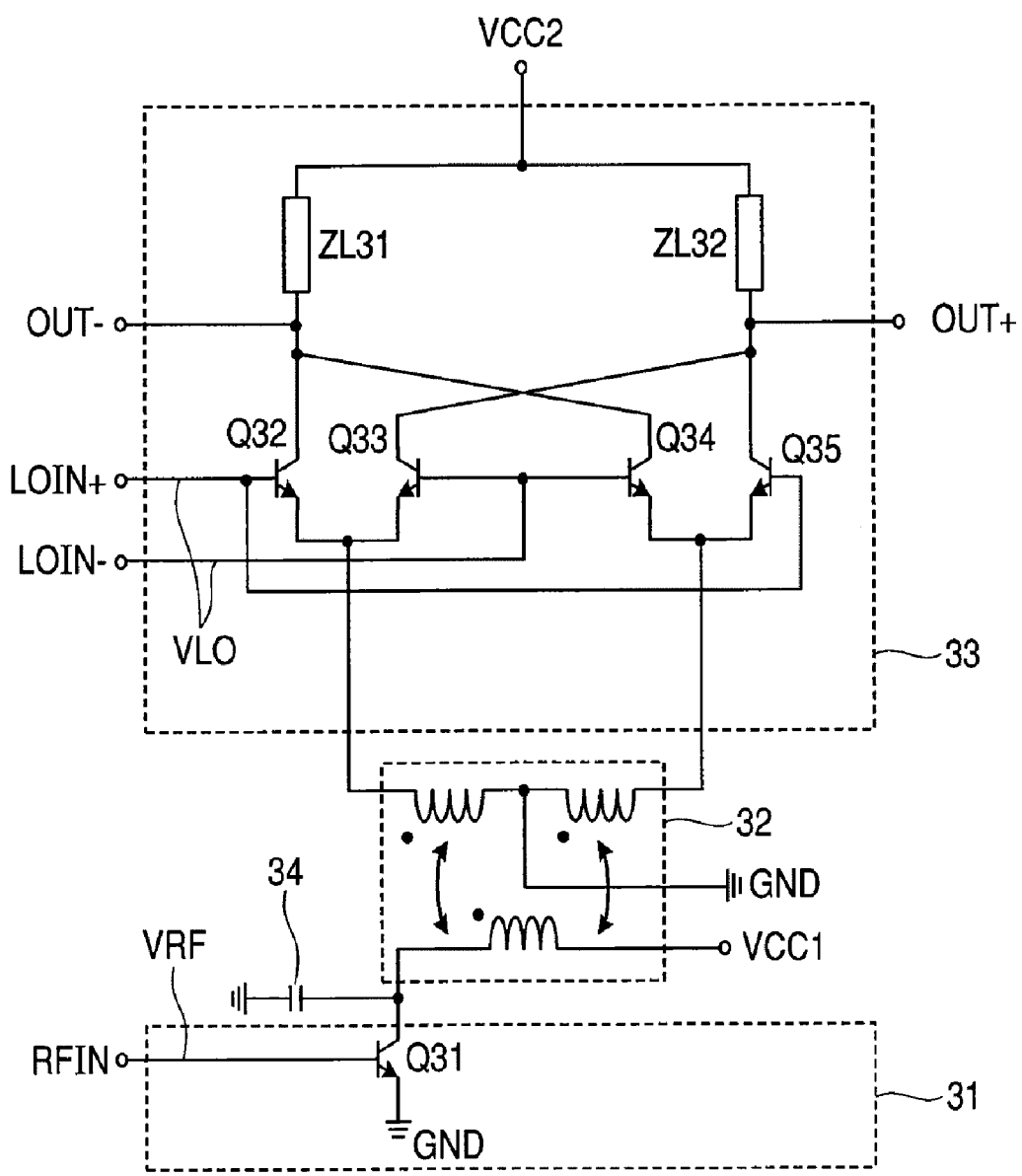
FIG. 7 is a diagram showing a detailed configuration example of the mixer circuit provided in the semiconductor integrated circuit according to another embodiment of the present invention.

FIG. 7 is a diagram showing a detailed configuration example of a mixer circuit provided in a semiconductor integrated circuit according to a fifth embodiment of the present invention.

The mixer circuit according to the one embodiment includes a transconductance amplifier 31 configured of a first transistor Q31, a transformer 32, and a multiplier 33 that includes second to fifth transistors Q32, Q33, Q34, and Q35 and first and second load elements (ZL31 and ZL32).

Further, in more preferable embodiment of the present invention, each of the first to fifth transistors Q31, Q32, Q33, Q34, and Q35 is a bipolar transistor. Also, in another preferable embodiment of the present invention, each of the first to fifth transistors Q31, Q32, Q33, Q34, and Q35 is a silicon germanium (SiGe) hetero-junction bipolar transistor. In still another embodiment of the present invention, each of the first to fifth transistors Q31, Q32, Q33, Q34, and Q35 is a field effect transistor. In still yet another embodiment of the present invention, each of the field effect transistors is a metal-oxide semiconductor (MOS) transistor. The following description will be made under the assumption that any one of the above-mentioned transistors is adopted.

A first input node RFIN of a base or a gate of the first transistor Q31 is connected to a predetermined first reference voltage VRF and the input signal of the first frequency is supplied to the first input node. Further, a collector or a drain of the first transistor Q31 is connected to the first node of the primary winding of the transformer 32 and an emitter or a source of the first transistor Q31 is connected to a predetermined second reference voltage GND. Further, the second node of the primary winding of the transformer 32 is connected to a third reference voltage VCC1.

A second input node LOIN+, which mutually connects bases or gates of the second and fifth transistors Q32 and Q35 of the multiplier 33, is connected to a predetermined fourth reference voltage VLO and the second input node is supplied with a positive phase input signal of the second frequency. A third input node LOIN−, which mutually connects bases or gates of the third and fourth transistors Q33 and Q34, is connected to a predetermined fourth reference voltage VLO and the third input node is supplied with a negative phase input signal of the second frequency.

Further, emitters or sources of the second and fifth transistors Q32 and Q35 are connected to each other and are connected to a first node of secondary winding of the transformer 32. In addition, emitters or sources of the third and fourth transistors Q33 and Q34 are connected to each other and are connected to a second node of the secondary winding of the transformer.

An intermediate node of the secondary winding of the transformer 32 is connected to a second reference voltage GND.

The first load element ZL31 is connected between a first output node OUT− that mutually connects collectors or drains of the second and third transistors Q32 and Q33 and a fifth reference voltage VCC2.

A second load element ZL32 is connected between a second output node OUT+ that mutually connects collectors or drains of the fourth and fifth transistors Q34 and Q35 and the fifth reference voltage VCC2.

A negative phase signal of a third frequency is output to a first output node OUT− and a positive phase signal of the third frequency is output to a second output node OUT+. The third frequency, which is the output signal, is the difference between the first frequency and the second frequency of the input signals.

In the fifth embodiment, the third reference voltage VCC1 to which the second node of the primary winding of the transformer 32 is connected and the intermediate node GND of the secondary winding of the transformer are separated from each other with respect to direct current inside the transformer 32. Therefore, in the transistors configuring the inside together with the transconductance amplifier 31 and the multiplier 33, the transistor that is connected in series between the supply voltages VCC1 and VCC2 and the reference voltage GND is only one-stage, such that the supply voltage capable of sufficiently operating the transistor can be suppressed to be lower. Further, when the signal amplified by the transconductance amplifier 31 passes through the transformer 32, the noise can be reduced.

In the fifth embodiment of the present invention, the transformer 32 is integrated into the semiconductor integrated circuit.

Further, in the fifth embodiment of the present invention, even the transistors of the voltage-to-current converter 31 as well as the transistors of the multiplier 33 may be configured of plural groups of transistors that are connected in parallel between the output terminal of the secondary winding of the transformer 2 and the reference voltage VCC2, that is, connected in parallel to one stage in a height direction of supply voltage as shown in FIG. 2. Thereby, the required supply voltage can be reduced. A high-speed MOS transistor, which has a low gate-source breakdown voltage of 1 V or less and a gate length less than 90 nm, may be used.

According to the present invention, the voltage, which is the difference between the third reference voltage VCC1 and the second reference voltage of the mixer circuit and the voltage, which is the difference between the fifth reference voltage VCC2 and the second reference voltage GND can be set to 0.5 V or more to 1.5 V or less.

Further, in order to confirm the operating principle of the circuit according to the fifth embodiment, as one example, it is designed so that the RF input signal is a radio frequency signal having a central frequency of 24 GHz and a bandwidth of 1 GHz, the local oscillator signal is 23 GHz, and the output central frequency is 1 GHz. The transistors Q31 to Q35 are configured as a SiGe hetero-junction bipolar transistor that has a cut-off frequency $f_T$ of approximately 140 GHz. Also, each of the primary winding and the secondary winding of the transformer 32 is configured by arranging an on-chip spiral inductor on the semiconductor integrated circuit formed by the SiGe hetero-junction bipolar transistor in a concentric circle. Both the supply voltages VCC1 and VCC2 are set to 1 V.

The radio frequency signal input to the RFIN is converted into the current signal by the transistor Q31 and is amplified by the conductance value gm of the transistor Q31. Further, the bias voltage VRF of the base of the transistor Q31 is set so that the collector current is 1 mA. The end of the primary winding of the transformer 2 is connected to the supply voltage VCC1. The intermediate node of the secondary winding of the transformer 2 is connected to the GND.

Although the direction of the secondary winding and 1C the direction of the primary winding are established in the direction shown in FIG. 7, any direction can be permitted. However, reversing a winding direction of the winding at both sides of the middle point of the secondary winding is not allowed because the transferred signal in the secondary winding is offset. When a coupling coefficient of the transformer is sufficiently large, a self-inductance Lt as an equivalent circuit of the transformer is connected between the input terminal and the ground terminal. Further, there is a sum capacitance Ct of the parasitic capacitance 34 of the transformer and the parasitic capacitance of the collector of the transistor Q31. The resonant frequency of Lt and Ct is represented by fres≈1/($2\pi\sqrt{(LtCt)}$).

In the design example of FIG. 7, Lt≈0.5 nH, Ct≈80 fF, and fres≈25 GHz. When the resonant frequency is fres, the impedance between the input node of the transformer and the ground is very large. For this reason, the signal input to the transformer is transferred to the multiplier 33 without minimal loss. It is difficult to accurately estimate the self-inductance Lt and the parasitic capacitance Ct by a simple calculation in the transformer included in the semiconductor integrated circuit and since the coupling coefficient is about 0.6 and the parasitic capacitance between the wires or the circuit boards is several 10 fF, there are many parasitic elements such as parasitic inductance, etc., in the transfer direction. For this reason, in an actual design, electromagnetic analysis on the transformer part is performed using a calculator and a numerical model obtained from the analysis result and a circuit simulation by the connection of the transistors are performed, making it possible to easily calculate an optimal value. Further, when Ct is smaller than a desired value, the capacitor element may be connected between the input terminal of the transformer 32 and the ground terminal.

Each of the transistors Q32 and Q33 and the transistors Q34 and Q35 configures a differential switch transistor pair, wherein they are connected to each other by being crossed at the collector terminals thereof. The local oscillator signal is input to the input terminals LOIN+ and LOIN−. The local oscillator signal having sufficiently large amplitude is input so that the transistors Q32, Q33, Q34, and Q35 can perform the switch operation. The current signal iRF of the radio frequency transferred via the transformer 2 is switched to a positive phase or a negative phase by each of the switch transistor pairs, such that the radio frequency is multiplied by the local oscillator frequency.

When each signal is represented by a trigonometrical function iRF·sin(ωRF) and cos(ωLO), the multiplication result shows that iRF·sin(ωRF)×cos(ωLO)=iRF/2·{sin(ωRF+ωLO)+sin(ωRF−ωLO)} and the difference in the frequency component iIF=iRF/2·sin(ωRF−ωLO) that is generated.

In the current signal of the obtained output frequency, the voltage amplitude of vIF=ZL·iRF/2·sin(ωRF−ωLO) is output by the impedance ZL of the load elements ZL31 and ZL32.

As a simple calculation result as described above, when there is no loss in the transfer characteristic of the transformer 32 that is an ideal characteristic in the resonant frequency, since iRF=vin·gm, the conversion gain is represented by gm·ZL/2.

This value is the same as the Gilbert cell type mixer and even in the configuration of the present invention; thus, it is shown that the same conversion gain as the Gilbert cell type mixer can be obtained.

The supply voltage required for the transistors Q31, Q32, Q33, Q34, and Q35 is approximately 1 V, which is ½ of the voltage required for the Gilbert cell type. Therefore, the voltage can be reduced while the same gain as the conversion gain of the Gilbert cell type is maintained.

Further, the bias current of the transistor Q31 and the bias current of the transistors Q32, Q33, Q34, and Q35 can be independently set from each other. Since the bias current of the transistors Q32, Q33, Q34, and Q35 is current required for the switch operation, it can be further reduced to about ⅕ than that of the transistor Q31. Even when current consumption increased due to the charge of the parasitic capacitance at the time of the switch operation is added, it is about ½ of the transistor Q31. As a result, power consumption, which is the product of the supply voltage and current consumption, is the supply voltage ½× the power consumption 3/2 and can be reduced to about ¾ as compared to the Gilbert cell type.

Next, the effects of the fifth embodiment will be described with reference to FIGS. 8 and 9 in consideration of the conversion gain of the mixer circuit and the frequency characteristic of the noise figure. Further, FIGS. 8 and 9 each shows the results obtained the computer calculation using circuit simulator software, but the design is made in consideration of using the same transistor parameters and the collector current of the transistors has the same value.

Figure 8:
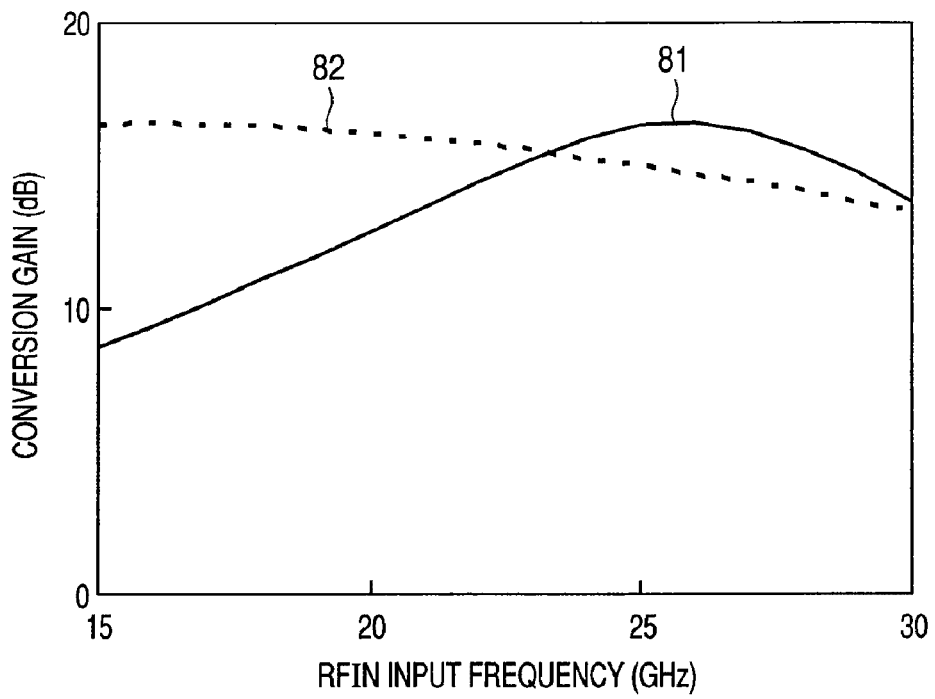
FIG. 8 is a diagram showing frequency characteristics of a frequency conversion gain of the mixer circuit provided in the semiconductor integrated circuit according to the embodiment of FIG. 7 and the mixer circuit provided in the semiconductor integrated circuit according to the conventional art of FIG. 16, respectively.

First, FIG. 8 shows the frequency characteristics of frequency conversion gains of the mixer circuit included in the semiconductor integrated circuit according to the one embodiment of the present invention of FIG. 7 and the mixer circuit included in the Gilbert cell type semiconductor integrated circuit in the conventional art, respectively.

A horizontal axis of FIG. 8 is the RF input frequency and a vertical axis is the frequency conversion voltage gain that is represented by dB. Further, the LO input frequency sets RF input frequency to 1 GHz so that the output frequency is 1 GHz. The LO input power −6 dBm. Solid line 81 represents the frequency characteristic of the frequency conversion gain of the mixer circuit according to the fifth embodiment of the present invention and dotted line 82 represents the frequency conversion gain of the Gilbert cell type mixer circuit according to the embodiment in the conventional art.

As can be appreciated from FIG. 8, the frequency dependence of solid line 81 represents the resonance characteristics of the transformer and the frequency dependence of dotted line 82 represents high-frequency cut-off characteristics that are generated by the load element and the parasitic capacitance. At this time, the supply voltage is 2 V in the circuit according to the conventional art, while it is 1 V in the circuit according to the present invention. Also, the current consumption of the circuit in the conventional art is 2 mA.

In the circuit according to the present invention, since the input of the transconductance amplifier is a single-ended, it is 1 mA and since the current consumption of the switch transistor pair of the multiplier is reduced to 0.9 mA, the current consumption of the mixer circuit is 1.9 mW. As a result, the circuit according to the embodiment in the conventional art has power consumption of 2 V×2 mA=4 mW, while the circuit according to the present invention has power consumption of 1 V×1.9 mA=1.9 mW, in which power consumption is reduced by 53%.

Figure 9:
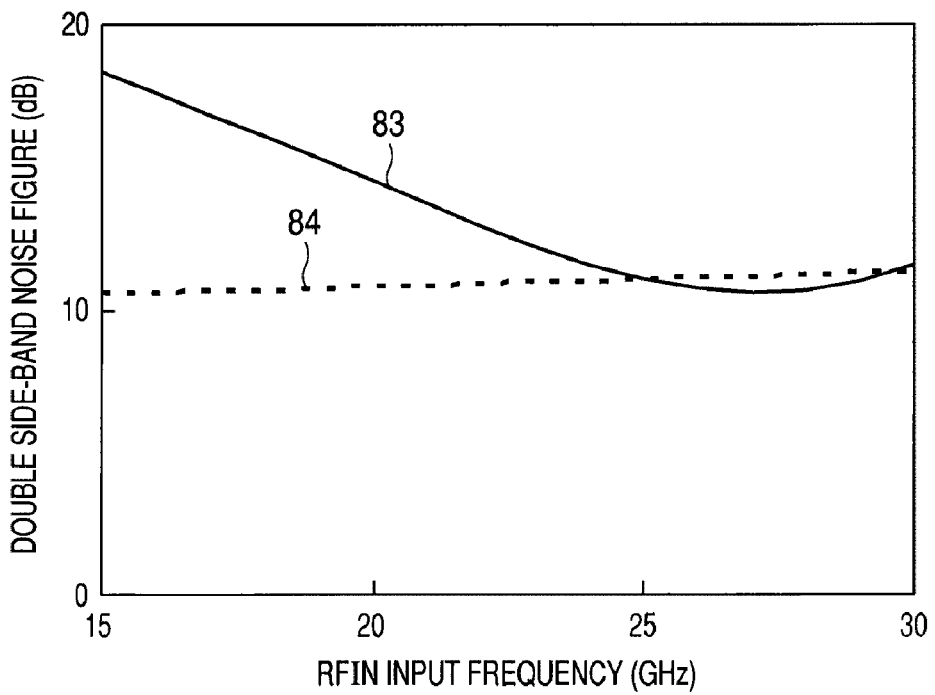
FIG. 9 is a diagram showing frequency characteristics of noise of the mixer circuit provided in the semiconductor integrated circuit according to the embodiment of FIG. 7 and the mixer circuit provided in the semiconductor integrated circuit according to the conventional art of FIG. 16, respectively.
Figure 16:
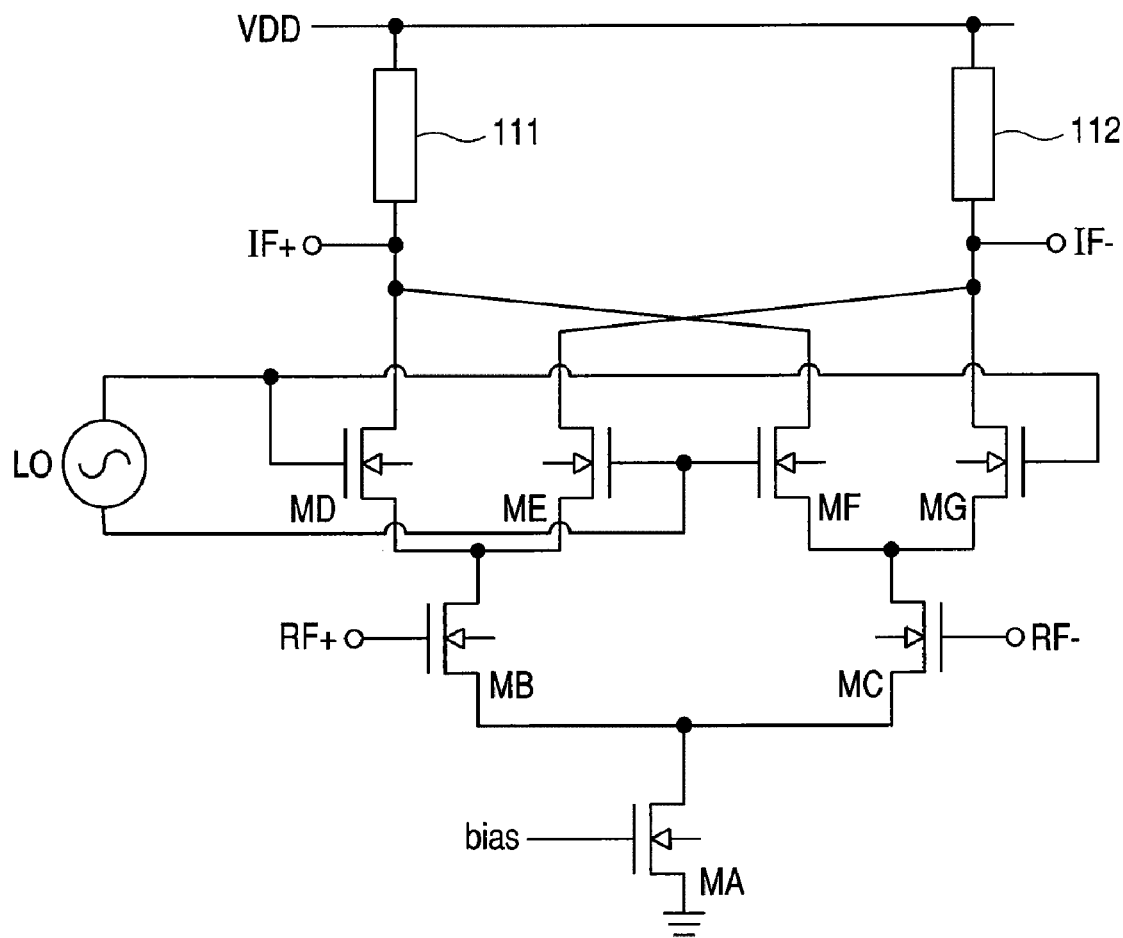
FIG. 16 is a diagram showing the mixer circuit according to a first conventional art.
Figure 17:
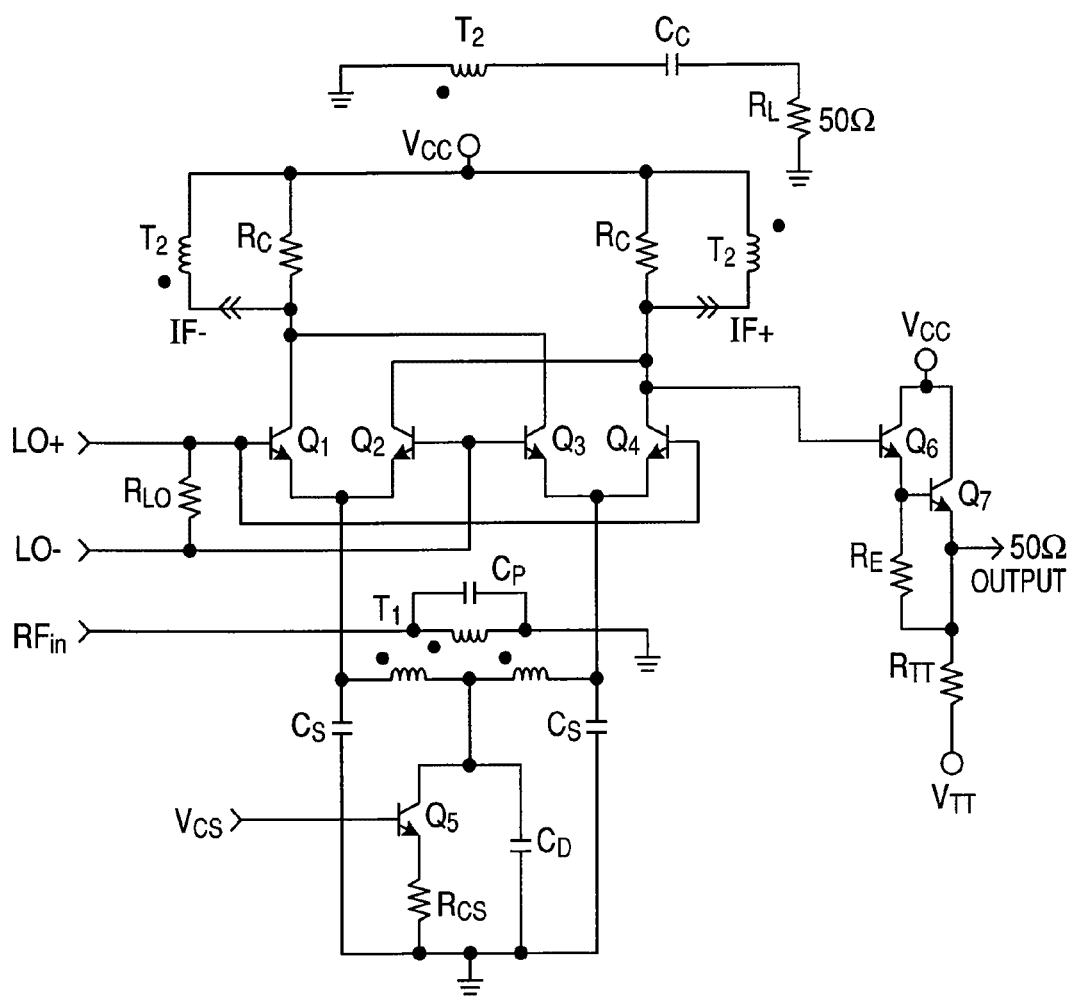
FIG. 17 is a diagram showing the mixer circuit according to a second conventional art.
Figure 18:
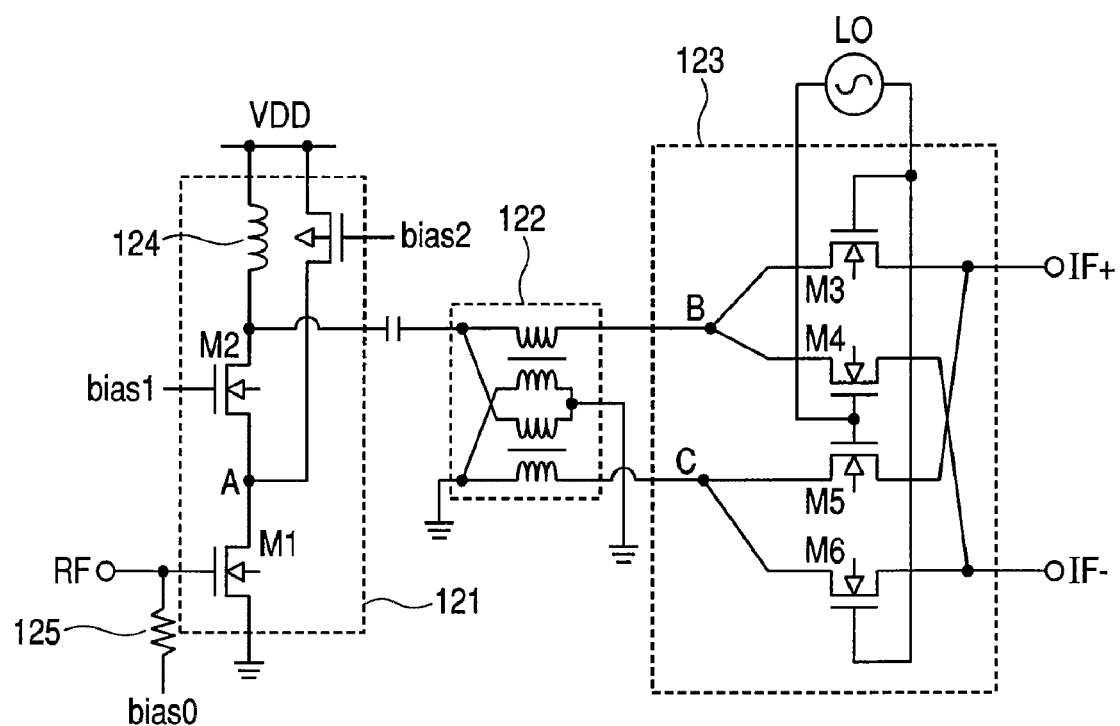
FIG. 18 is a diagram showing the mixer circuit according to a third conventional art.

Next, FIG. 9 shows the frequency characteristics of noise of the mixer circuit included in the semiconductor integrated circuit according to one embodiment of the present invention of FIG. 7 and the mixer circuit included in the semiconductor integrated circuit in the conventional art of FIG. 16, respectively. A horizontal axis is the RF input frequency and a vertical axis is a double side-band noise figure that is represented by dB. The double side-band noise figure is a figure that calculates a ratio between the input and output of S/N for the double side-band based on the local oscillator frequency input to the mixer circuit. The bias conditions are the same as the case of FIG. 8. Solid line 83 represents the frequency characteristics of noise of the mixer circuit according to the one embodiment of the present invention and line 84 represents the frequency characteristics of noise of the mixer circuit in the conventional art. The mixer circuits are designed to have an optical value near 24 GHz, such that any mixer circuit can all obtain the frequency conversion gain of approximately 15 dB.

As can be appreciated from FIG. 9, it shows that the double side-band noise figure of any mixer circuit conforms to approximately 11 dB at 24 GHz and there is no difference in the characteristics of the designed predetermined radio frequency even when the supply voltage is reduced with respect to the Gilbert cell type.

It can be appreciated from the results of FIGS. 8 and 9 that the supply voltage can be reduced by ½ and the power consumption can be reduced by approximately ½ while maintaining the same characteristics as the conversion gain of the Gilbert cell type mixer circuit in the conventional art.

In other words, according to the present invention, the semiconductor integrated circuit including the mixer circuit that reduces the supply voltage required for operation can be provided. Further, the semiconductor integrated circuits including the mixer circuit that is operated at high frequency, low noise, and low power consumption can be provided.

Sixth Embodiment

Figure 10:
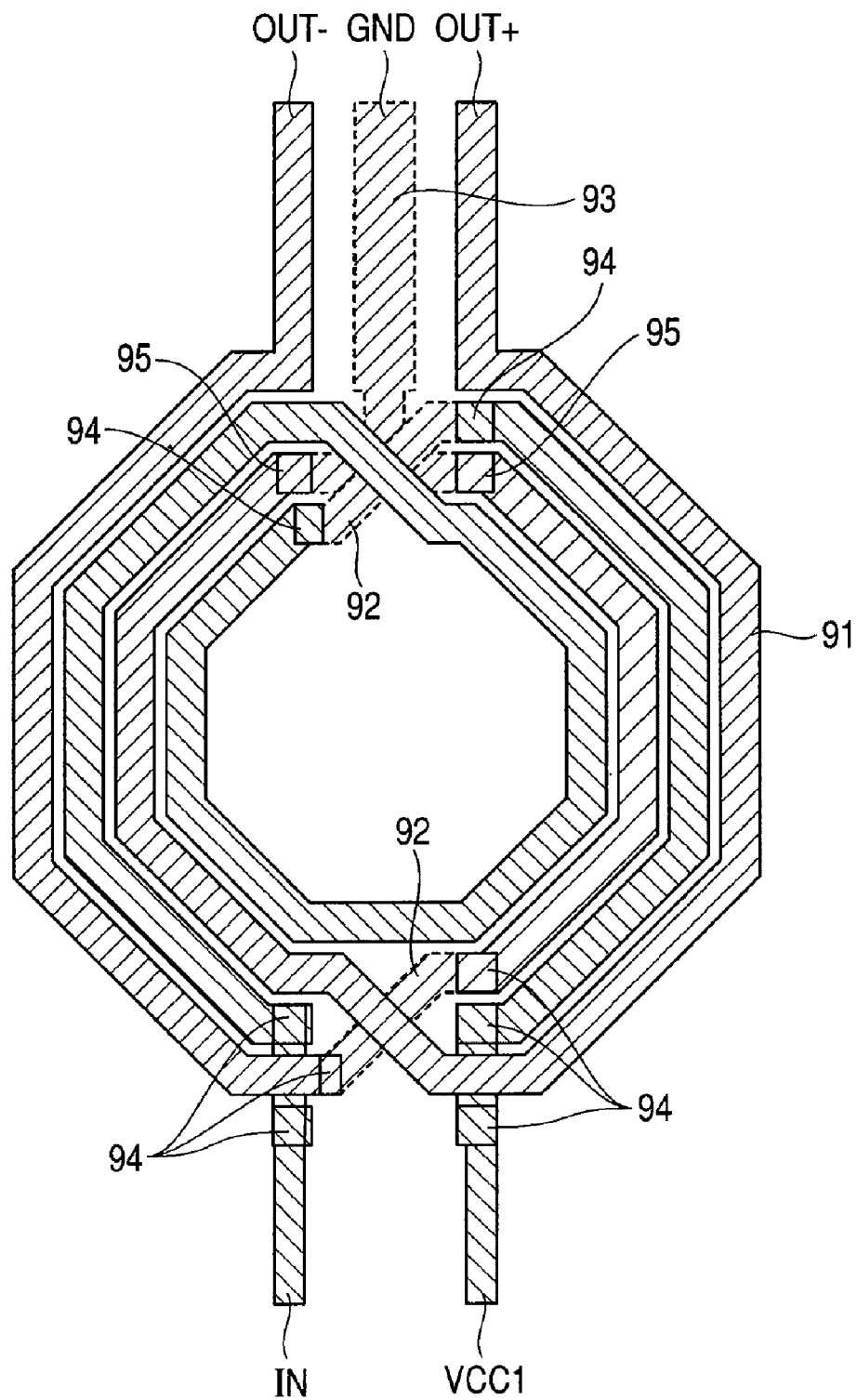
FIG. 10 is a diagram showing an example of a wire layout of transformers provided in the semiconductor integrated circuit of FIG. 7 viewed from an upper surface.

Next, the configuration example of the transformer suitable for an embodiment of the present invention will be described. FIG. 10 shows a wire layout viewed above the transformer included in the semiconductor integrated circuit of FIG. 7.

In order to maximally reduce the parasitic resistance, a spiral inductor 91 is configured using a top layer having a metal thickness of 3 μm at maximum. In order to more increase the magnetic coupling, in intersecting portion, a space between the wires is reduced to 2 μm. Both the primary winding and the secondary winding each have two windings and are arranged to be alternately intersected using a middle metal layer 92, a lower metal layer 93, and VIAs 94 and 95 that connect each metal layer. Only the second winding is drawn out as the lower metal layer 93 from the middle point to install the node. The primary winding and the secondary winding have a wire width of 6.5 μm, each of the self inductances is approximately 0.5 nH, and the coupling coefficient is approximately 0.6. An outer diameter dimension of the transformer is approximately 130 μm.

According to the sixth embodiment, the transformer having the thin metal thickness and the small outer diameter dimension as well as the small-sized mixer circuit included in the semiconductor integrated circuit can be provided.

Further, the shape of FIG. 10 is only one example of a configuration and therefore, it can be configured in various shapes. Further, the configuration of the transformer shown in FIG. 10 can be easily manufactured by using a method for manufacturing the wire layer of the general semiconductor integrated circuit.

Seventh Embodiment

Hereinafter, another configuration example of a mixer circuit according to the present invention will be described.

Figure 11:
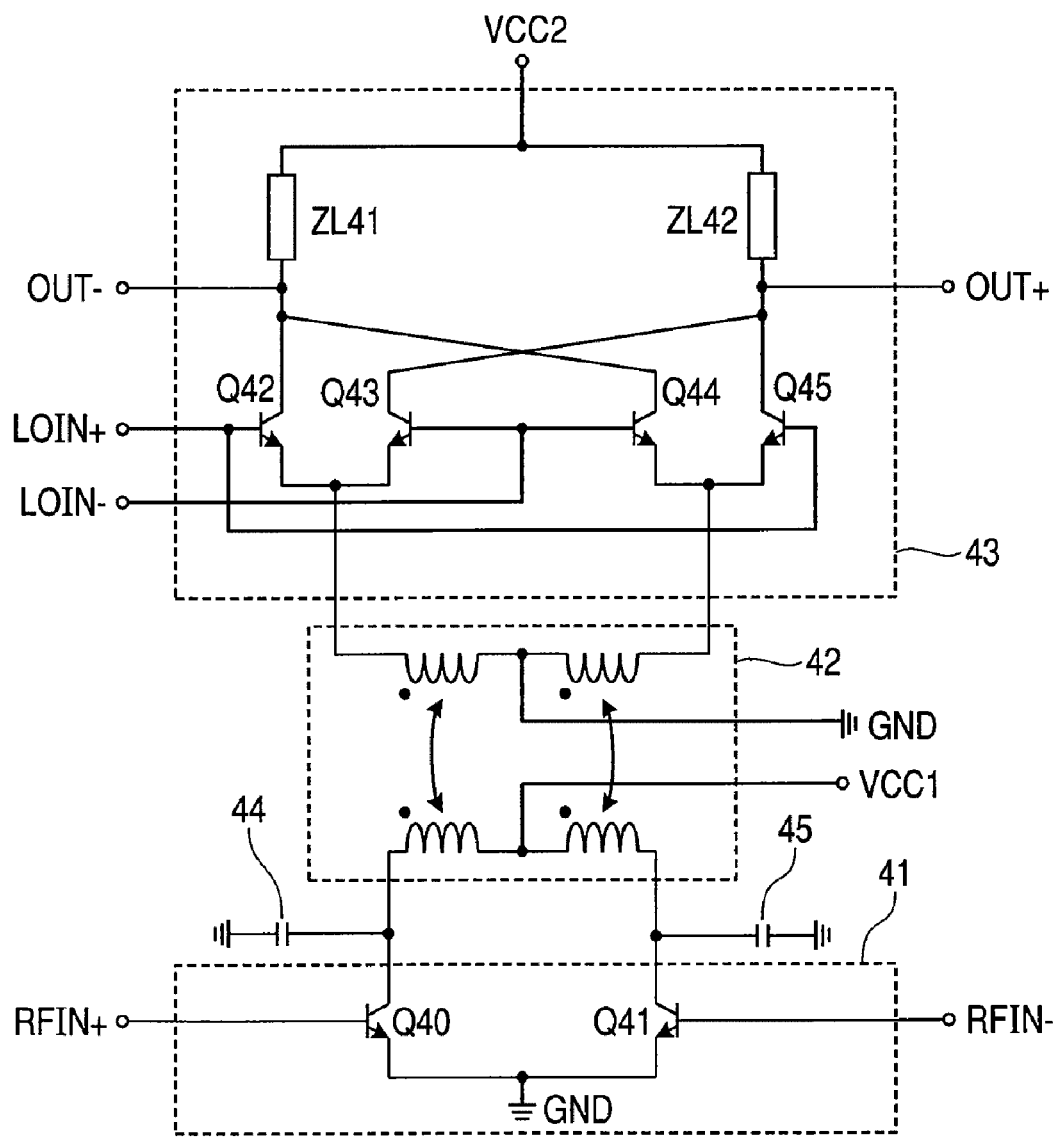
FIG. 11 is a diagram showing an example of the mixer circuit provided in the semiconductor integrated circuit according to another embodiment of the present invention.

FIG. 11 is a diagram showing a mixer circuit included in a semiconductor integrated circuit according to a seventh embodiment of the present invention. Unlike the embodiment of FIG. 7, the mixer circuit of the seventh embodiment is a differential input type mixer circuit and includes a transconductance amplifier 41 configured of first and second transistors Q40 and Q41, a transformer 42, and a multiplier 43 that includes third to sixth transistors Q42, Q43, Q44, and Q45 and first and second load elements ZL41 and ZL42.

In other words, the mixer circuit includes the first to sixth transistors Q40 to Q45, the first and second load elements ZL41 and ZL42, and the transformer 42. A first input node of a base or gate of the first transistor Q40 is connected to a predetermined first reference voltage VRF and the first input node is supplied with a positive phase input signal of a first frequency. Further, a second input node of a base or gate of the second transistor Q41 is connected to a predetermined first reference voltage VRF, and the second input node is supplied with a negative phase input signal of the first frequency. Also, a collector or a drain of the first transistor Q40 is connected to a first node of the primary winding of the transformer 42 and a collector or a drain of the second transistor Q1 is connected to a second node of the primary winding of the transformer. Moreover, an intermediate node of the primary winding of the transformer 42 is connected to a third reference voltage VCC1 and emitters or sources of the first and second transistors Q40 and Q41 are connected to a predetermined second reference voltage GND.

A third input node, which mutually connects bases or gates of the third and sixth transistors Q42 and Q45, is connected to a predetermined fourth reference voltage VLO and the third input node is supplied with a positive phase input signal LOIN+ of the second frequency. Further, a fourth input node, which mutually connects bases or gates of the fourth and fifth transistors Q43 and Q44, is connected to a predetermined fourth reference voltage VLO and the fourth input node is supplied with a negative phase input signal LOIN− of the second frequency. Also, emitters or sources of the third and sixth transistors Q42 and Q45 are connected to each other and are connected to a first node of a secondary winding of the transformer 42 and emitters or sources of the fourth and fifth transistors Q43 and Q44 are connected to each other and are connected to a second node of the secondary winding of the transformer 42.

An intermediate node of the secondary winding of the transformer 42 is connected to a second reference voltage GND and the first load element ZL41 is connected between a first output node, which mutually connects a collector or a drain of the third and fourth transistors Q42 and Q43 and a fifth reference voltage VCC2. Meanwhile, the second load element ZL42 is connected between a second output node, which mutually connects collectors or drains of the fifth and sixth transistors Q44 and Q45, and the fifth reference voltage VCC2.

The first output node receives a negative phase signal of a third frequency and the second output node receives a positive phase signal of the third frequency, wherein the third frequency, which is the output signal, is the difference between the first frequency and the second frequency, which are the input signals.

The intermediate node VCC1 of the primary winding of the transformer 42 and the intermediate node GND of the secondary winding of the transformer are separated from each other with respect to direct current inside the transformer. There are capacitances 44 and 45 which are the sum of parasitic capacitance of the transformer 42 and the transistors Q40 or the sum of parasitic capacitance of the transformer 42 and the transistor Q41, respectively.

According to the seventh embodiment, the semiconductor integrated circuit including the mixer circuit that reduces the supply voltage required for operation can be provided. Further, the semiconductor integrated circuits including the mixer circuit that is operated at high frequency, low noise, and low power consumption can be provided.

Further, when the mixer input signal of the receiver circuit is previously designed as the differential signal, the Gilbert cell type mixer circuit and the mixer circuit of the seventh embodiment can be substituted. Since the circuit configuration has better symmetry than FIG. 7, the leakage output power of the local oscillator signal, which is an unnecessary frequency of the mixer output, is offset inside thereof and thus, can be reduced.

Eighth Embodiment

Another configuration example of a mixer circuit of the present invention will be described.

Figure 12:
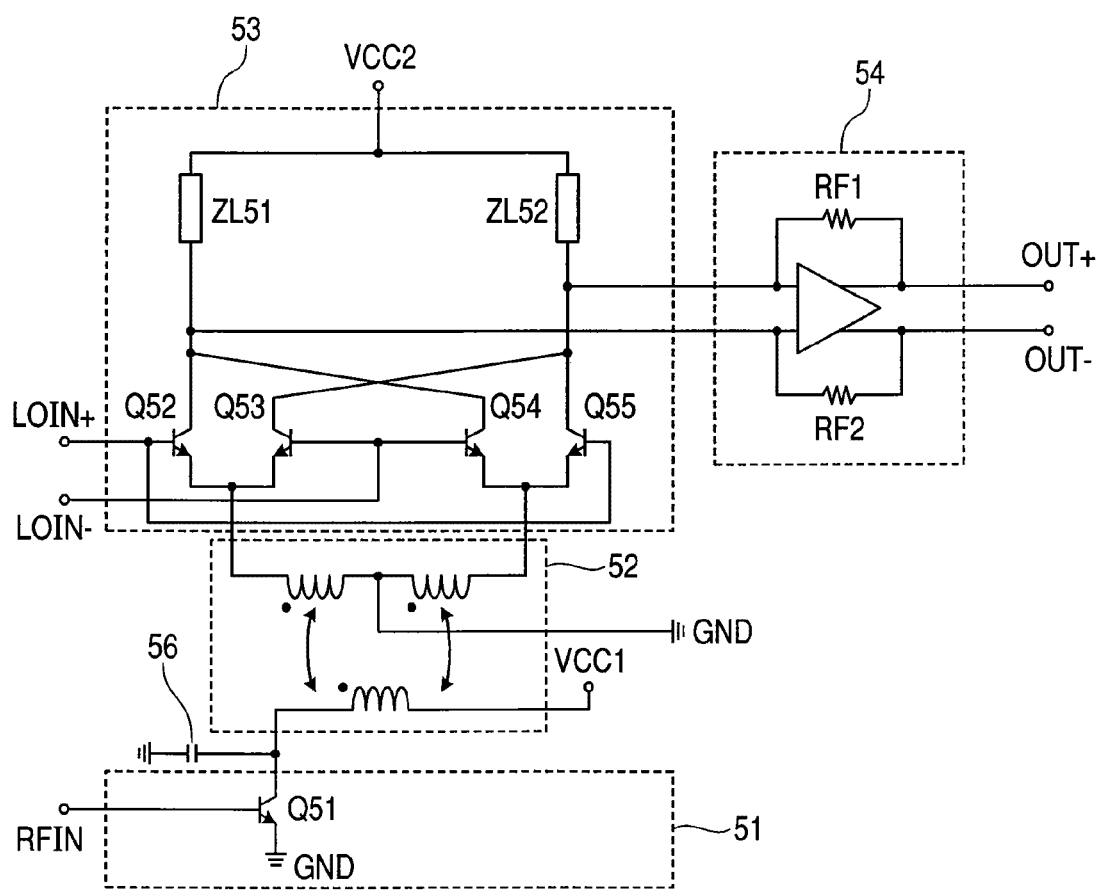
FIG. 12 is a diagram showing an example of the mixer circuit built in a feedback amplifier that is provided in the semiconductor integrated circuit according to another embodiment of the present invention.

FIG. 12 is a diagram showing a mixer circuit built in a feedback amplifier included in a semiconductor integrated circuit according to an eighth embodiment of the present invention. In the eighth embodiment, each of the feedback amplifiers 54 is connected to a later stage of the mixer circuit of FIG. 7. The mixer circuit built in the feedback amplifier includes the mixer circuit and the feedback differential amplifier 54 and is connected to a second output node of the mixer circuit and a first input node of the feedback differential amplifier. Further, the first output node of the mixer circuit and the second input node of the feedback differential amplifier are connected to each other.

In other words, the mixer circuit includes a transconductance amplifier 51 configured of a first transistor Q51, a transformer 52, and a multiplier 53 that includes second to fifth transistors Q52, Q53, Q54, and Q55 and first and second load elements ZL51 and ZL52. There is a combined parasitic capacitance 56 of the transformer 52 and the transistor Q51.

A first input node RFIN of the mixer circuit, which connects a base or a gate of the first transistor Q51 is connected to a predetermined first reference voltage VRF and the first input node is supplied with an input signal of a first frequency. A collector or a drain of the first transistor Q51 is connected to a first node of a primary winding of the transformer 52 and an emitter or a source of the first transistor Q51 is connected to a predetermined second reference voltage GND. A second node of the primary winding of the transformer 52 is connected to a third reference voltage VCC1. A second input node LOIN+ of the mixer circuit, which mutually connects bases or gates of the second and fifth transistors Q52 and Q55, is connected to a predetermined fourth reference voltage VLO and the second input node is supplied with a positive input signal of a second frequency.

A third input node LOIN− of the mixer circuit, which mutually connects bases or gates of the third and fourth transistors Q53 and Q54, is connected to a predetermined fourth reference voltage VLO and the fourth reference voltage is supplied with a negative phase input signal of the second frequency. Emitters or sources of the second and fifth transistors Q52 and Q55 are connected to each other and are connected to a first node of a secondary winding of the transformer 52. Emitters or sources of the third and fourth transistors Q53 and Q54 are connected to each other and are connected to a second node of the secondary winding of the transformer 52.

An intermediate node of the secondary winding of the transformer 52 is connected to a second reference voltage GND. A first load element ZL51 is connected between a first output node of the mixer circuit, which mutually connects a collector or a drain of the second and third transistors Q52 and Q53 and a fifth reference voltage VCC2. A second load element ZL52 is connected between a second output node of the mixer circuit, which mutually connects collectors or drains of the fourth and fifth transistors Q54 and Q55, and the fifth reference voltage VCC2.

A first output node OUT− of the differential amplifier 54 receives a negative phase signal of a third frequency and a second output node OUT+ of the differential amplifier 54 receives a positive phase signal of the third frequency.

The feedback differential amplifier 54 includes first and second feedback resistor RF1 and RF2 and a differential amplification circuit, the first feedback resistor RF1 is connected between a first input node and a first output node of the differential amplification circuit, and the second feedback resistor RF2 is connected between a second input node and a second output node of the differential amplification circuit.

Resistance values of the first and second feedback resistors RF1 and RF2 are formed so that each of the input impedances of the first and second input nodes of the feedback differential amplifier 54 is smaller than the impedances of the first and second load elements ZL51 and ZL52 of the mixer circuit. There is a combined parasitic capacitance 56 of the transformer 52 and the transistor Q51.

The third frequency, which is the output signal of the feedback differential amplifier 54, is the difference between the first frequency and the second frequency, which are the input signals. The second node VCC1 of the primary winding of the transformer 52 and the intermediate node GND of the secondary winding of the transformer 52 are separated from each other with respect to direct current inside the transformer 52. As a result, in the transistors configuring inside together with the transconductance amplifier 51 and the multiplier 53, the transistor that is connected in series between the supply voltages VCC1 and VCC2 and the reference voltage GND is only one-stage, such that the supply voltage capable of sufficiently operating the transistor can be suppressed to be lower.

Further, the input impedance of the feedback differential amplifier 54 is small, such that the voltage amplitude of the differential output node of the multiplier 53 can be small and the supply voltage VCC2 of the multiplier 53 can be suppressed to be lower while maintaining the conversion gain of the mixer circuit. Also, since the signal amplified by the transconductance amplifier 51 passes through the transformer 52, the noise can be reduced.

In the preferred embodiment of the present invention, each of the transistors Q51, Q52, Q53, Q54, and Q55 is a bipolar transistor. In more preferred embodiment of the present invention, each of the bipolar transistors is a silicon germanium (SiGe) hetero-junction bipolar transistor.

In another preferred embodiment of the present invention, the transistors Q51, Q52, Q53, Q54, and Q55 are field effect transistors. In still another embodiment of the present invention, each of the field effect transistors is a metal-oxide semiconductor (MOS) transistor.

In the eighth embodiment of the present invention, the transformer 52 is integrated into the semiconductor integrated circuit.

In the eighth embodiment of the present invention, the voltage, which is the difference between the third reference voltage VCC1 and the second reference voltage of the mixer circuit and the voltage, which is the difference between the fifth reference voltage VCC2 and the second reference voltage GND can be set to 0.5 V or more to 1.5 V or less.

Ninth Embodiment

Figure 13:
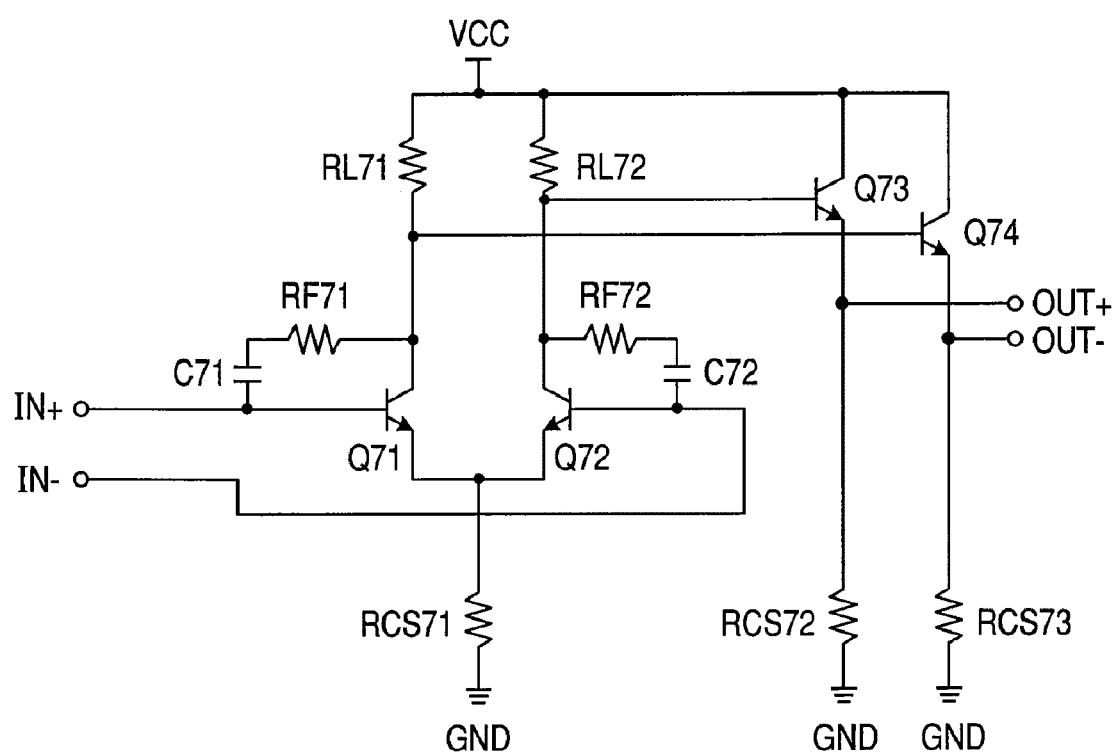
FIG. 13 is a diagram showing a configuration example of the feedback amplifier in the semiconductor integrated circuit of FIG. 12.

FIG. 13 is a diagram showing a detailed configuration example of the feedback amplifier 54 included in the semiconductor integrated circuit of FIG. 12. Feedback resistors RF71 and RF72 feedback an output signal of an amplifier to an input of the feedback amplifier and configure a negative feedback circuit.

In other words, the feedback amplifier includes first to fourth transistors Q71 to Q74, first and second load resistors RL71 and RL72, first and second feedback resistors RF71 and RF 72, first to third bias resistors RCS71 to RCS 73, and first and second capacitors C71 and C72. A first input node of the feedback amplifier connects a base or a gate of the first transistor Q71 to a first node of the first capacitor C71 and a second input node of the feedback amplifier connects a base or a gate of the second transistor Q72 to a first node of the second capacitor C72. Further, emitters or sources of the first and second transistors Q71 and Q72 are connected to each other and are connected to the first node of the first bias resistor RCS 71 and a second resistor of the first bias resistor is connected to the first reference voltage GND. A collector or a drain of the first transistor Q71, a first node of the first feedback resistor RF71, a first node of the first load resistor RL71, and a base or a gate of the fourth transistor Q74 are connected each other. A collector or a drain of the second transistor Q72, a first node of the second feedback resistor RF72, a first node of the second load resistor RL72, and a base or a gate of the third transistor Q73 are connected to each other. A second node of the first feedback resistor RF71 is connected to a second node of the first capacitor C71 and a second node of the second feedback resistor RF72 is connected to a second node of the second capacitor C72. Further, second nodes of the first and second load elements RL71 and RL72 are connected to each other. Also, the second nodes of each of the first and second load elements RL71 and RL72 are a second reference voltage VCC and collectors or drains of each of the third and fourth transistors Q73 and Q74 are also connected to the second reference voltage VCC. Moreover, an emitter or a source of the third transistor Q73 is connected to a first node of the second bias resistor RCS72 to form the first output node of the feedback amplifier and an emitter or a source of the fourth transistor Q74 is connected to a first node of the third bias resistor RCS73 to form the first output node of the feedback amplifier. In addition, the second nodes of each of the second and third bias resistors RCS72 and RCS73 are connected to the first reference voltage GND.

If the conductance of the transistors Q71 and Q72 is gm, the feedback resistor RF, and the load resistor RL, the input impedance Zin is represented by approximately RF/(gm·RL) and if the gm·RL is sufficiently increased to about 10, the Zin is reduced to have a low value of $\frac{1}{10}$ of the RL. As a result, the current signal is input to the feedback amplifier by reducing Zin to about $\frac{1}{10}$ of the load elements ZL51 and ZL52 and the voltage signal is amplified and converted in the output of the feedback amplifier. Further, the transistors Q73 and Q74 configure an emitter follower. The current-voltage amplification ratio ZF is approximately the same as RF when gm·RL is sufficiently increased to about 10.

As such, the output amplitude of the mixer circuit can be reduced by connecting a feedback amplifier having small input impedance. In other words, the amplitude of the collectors of Q52, Q53, Q54, and Q55 configuring the switch transistor pair of the multiplier 53 is reduced. As a result, the supply voltage can be reduced by making the collector-emitter voltage margin small. Further, the high-frequency cut-off characteristic generated by the parasitic capacitance of the collector and the impedance of the load element are mitigated and the mixer circuit can be operated at a higher frequency. Also, in the mixer circuit, large-signal characteristics of a third-order intercept point IIP3 or a 1 dB compression point P1dB can be improved.

Tenth Embodiment

Another configuration example of a mixer circuit according to a tenth embodiment of the present invention will be described.

Figure 14:
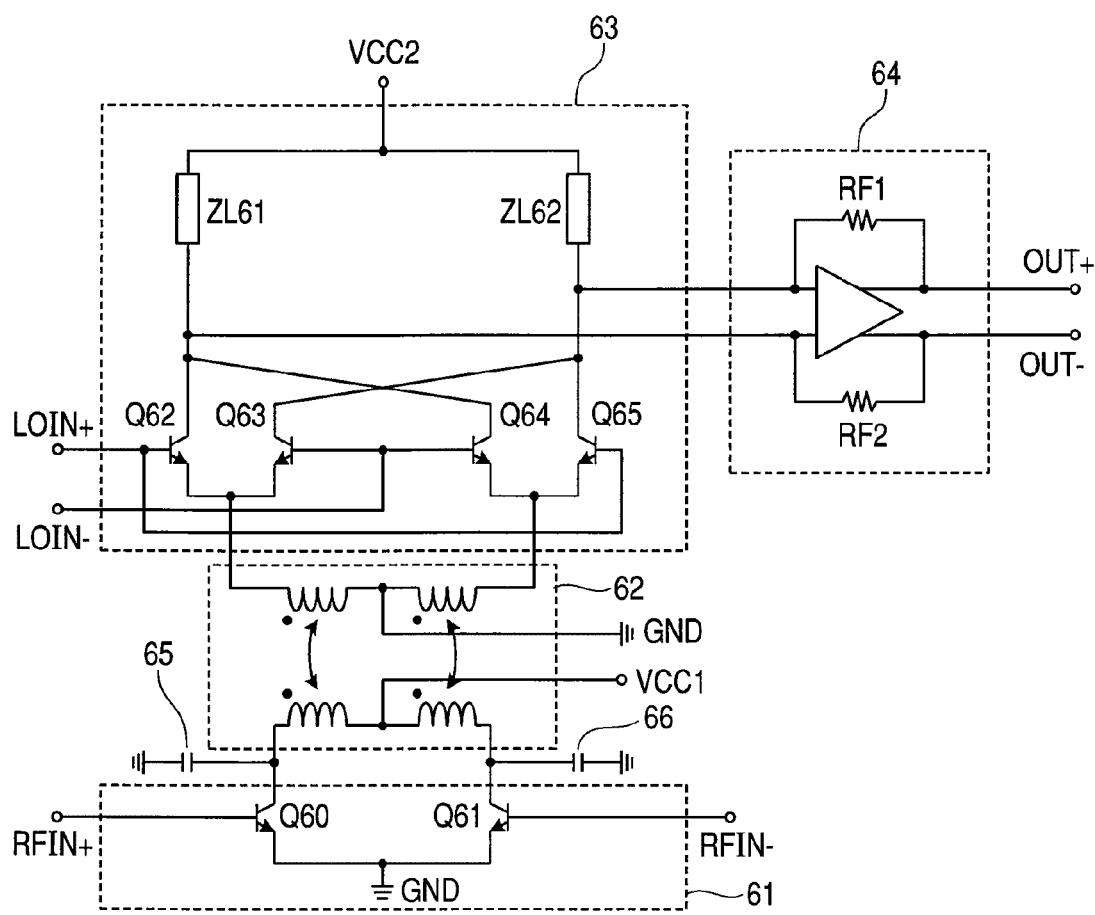
FIG. 14 is a diagram showing an example of the mixer circuit built in the feedback amplifier that is provided in the semiconductor integrated circuit according to still another embodiment of the present invention.

FIG. 14 is a diagram showing a mixer circuit built in a feedback amplifier that is included in a semiconductor integrated circuit according to a tenth embodiment of the present invention. In the tenth embodiment, a feedback amplifier 64 is connected to a later stage of the mixer circuit of the embodiment shown in FIG. 11. In other words, the mixer circuit built in the feedback amplifier is a differential input type mixer circuit and includes a transconductance amplifier 61 configured of first and second transistors Q60 and Q61, a transformer 62, a multiplier 63 that includes third to sixth transistors Q62, Q63, Q64, and Q65 and first and second load elements ZL61 and ZL62, and a feedback amplifier 64. A detailed configuration of the feedback amplifier 64 is the same as the feedback amplifier shown in FIG. 13, for example.

In other words, a second output node of the multiplier 63 is connected to a first input node of the feedback differential amplifier 64, a first output node of the multiplier 63 is connected to a second input node of the feedback differential amplifier, a first output node of the feedback differential amplifier 64 is connected to the first input node of the feedback differential amplifier via a first feedback resistor RF1, a second output node of the feedback differential amplifier 64 is connected to a second input node of the feedback differential amplifier via a second feedback resistor RF2.

A first input node of the mixer circuit, which connects a base or a gate of the first transistor Q60, is connected to a predetermined first reference voltage VRF and the first input node is supplied with a positive phase input signal of a first frequency (RFIN+). Further, a second input node of the mixer circuit, which connects a base or a gate of the second transistor Q61, is connected to a predetermined first reference voltage VRF and is supplied with a negative phase input signal of a first frequency (RFIN-), a collector or a drain of the first transistor Q60 is connected to a first node of the primary winding of the transformer 62 and a collector or a drain of the second transistor Q61 is connected to a second node of the primary winding of the transformer.

Further, an intermediate node of the primary winding of the transformer is connected to a third reference voltage VCC1, emitters or sources of the first and second transistors (Q60, Q61) are connected to a predetermined second reference voltage GND, a third input node, which mutually connects bases or gates of the third and sixth transistors (Q62, Q65), are connected to a predetermined fourth reference voltage VLO, and the third input node is supplied with a positive phase input signal of a second frequency (LOIN+). Also, a fourth input node, which mutually connects bases or gates of the fourth and fifth transistors (Q63, Q64), is connected to a predetermined fourth reference voltage VLO and is supplied with a negative phase input signal of a second frequency (LOIN-), emitters or sources of the third and sixth transistors (Q62, Q65) are connected to each other and are connected to a first node of the secondary winding of the transformer 62, emitters or sources of the fourth and fifth transistors (Q63, Q64) are connected to each other and are connected to a second node of the secondary winding of the transformer, and an intermediate node of the secondary winding of the transformer is connected to a second reference voltage GND.

Further, a first load element ZL61 is connected between a first output node, which mutually connects collectors or drains of the third and fourth transistors (Q62, Q63), and a fifth reference voltage VCC2 and a second load element ZL62 are connected between a second output node, which mutually connects collectors or drains of the fifth and sixth transistors (Q64, Q65), and a fifth reference voltage VCC2.

The first output node of the mixer circuit receives a negative phase signal of a third frequency and the second output node of the mixer circuit receives a positive phase signal of the third frequency, wherein the third frequency, which is the output signal, is the difference between the first frequency and the second frequency, which are the input signals. The first output node of the mixer circuit is connected to a first input node of the feedback differential amplifier 64 and the second output node of the mixer circuit is connected to a second input node of the feedback differential amplifier 64. Further, the second node VCC1 of the primary winding of the transformer and the intermediate node GND of the secondary winding of the transformer are separated from each other with respect to direct current inside the transformer. There are capacitances 65 and 66 which are the sum of parasitic capacitance of the transformer 62 and the transistor Q60 or the sum of parasitic capacitance of the transformer 62 and the transistor Q61, respectively.

As such, the output amplitude of the mixer circuit can be reduced by connecting the feedback amplifier 64 having small input impedance to a later stage of the mixer circuit. In other words, the amplitude of the collectors of Q62, Q63, Q64, and Q65 configuring the switch transistor pair of the multiplier 63 is reduced. As a result, the supply voltage can be reduced by making the collector-emitter voltage margin small. Further, the high-frequency cut-off characteristic generated by the parasitic capacitance of the collector and the impedance of the load element are mitigated and the mixer circuit can be operated at a higher frequency. Also, in the mixer circuit, large-signal characteristics of a third-order intercept point IIP3 or a 1 dB compression point P1dB can be improved.

Eleventh Embodiment

Hereinafter, an embodiment of a millimeter-wave communication unit including a mixer circuit of the present invention will be described.

Figure 15:
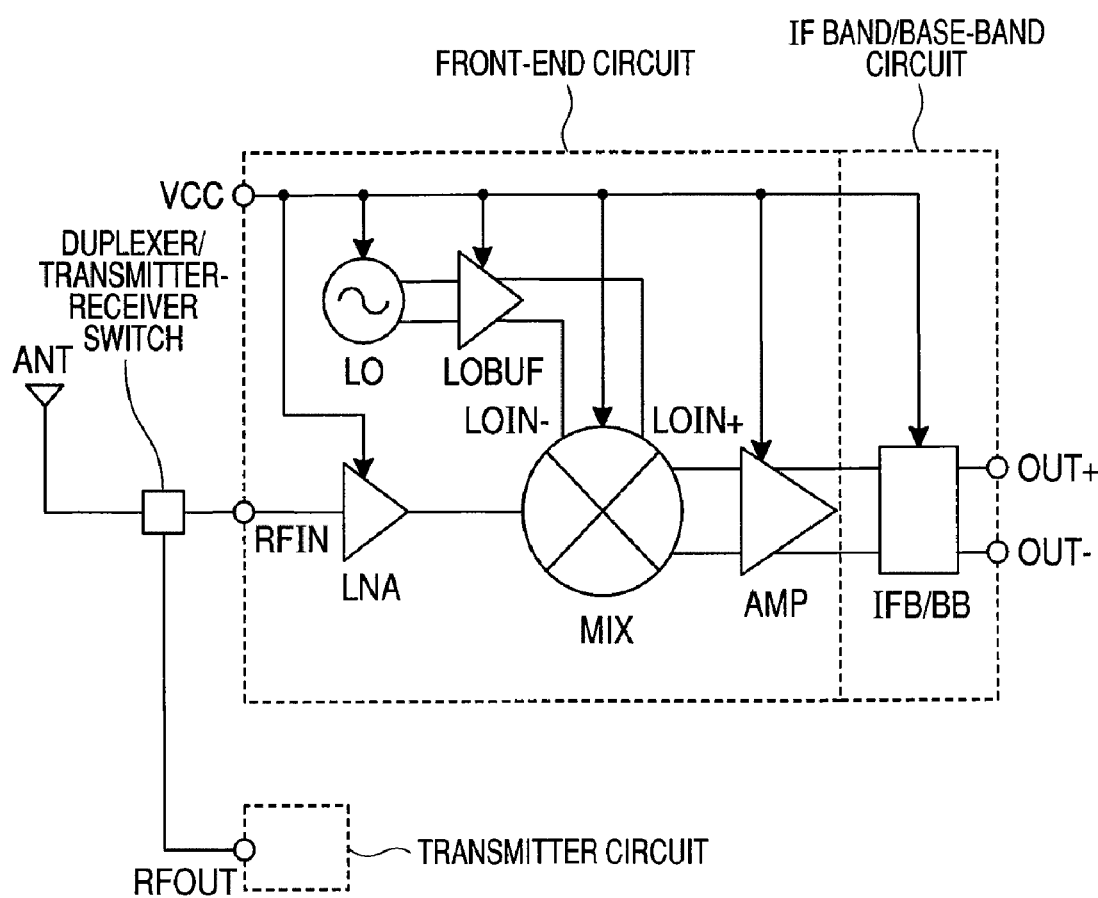
FIG. 15 is a diagram showing an entire configuration example of a receiver circuit of a millimeter-wave communication unit that is provided in the semiconductor integrated circuit according to another embodiment of the present invention.

FIG. 15 is a diagram showing an entire configuration example of a receiver circuit of a millimeter-wave communication unit that is included in the semiconductor integrated circuit according to an eleventh embodiment of the present invention. The millimeter-wave communication unit includes a duplexer that is connected between an antenna and an RFIN terminal of a receiver circuit and an RFOUT terminal of a transmitter circuit or a transmitter/receiver switch. The receiver circuit includes a front-end circuit block and an IF band circuit or a baseband circuit block. A detailed configuration of the front-end circuit block is the same as a block configuration of the wireless communication receiver circuit shown in FIG. 4, for example. A signal processing circuit of an IF band circuit/baseband circuit block is connected to an output terminal of a second differential amplification circuit (AMP) that amplifies the output signal fOUT of the mixer circuit (MIX) of the front-end circuit block, wherein the signal processing circuit performs the signal process such as demodulation and outputs the process results from the output terminals OUT+ and OUT−. The receiver circuit is, for example, configured so that MMOS transistors and bipolar transistors are mixed.

The radio frequency signal fRF is input to the input terminal RFIN of the receiver circuit and is amplified to a predetermined gain by the low-noise amplifier LNA. The amplified signal is input to the mixer circuit MIX. In the mixer circuit MIX, fOUT signal, which is the difference frequency between the radio frequency fRF and the local oscillator frequency fLO, is output. The output signal fOUT is amplified and output up to predetermined amplitude by a second differential amplification circuit AMP and is input and demodulated to the signal processing circuit of the IF band circuit/baseband circuit block.

According to the present invention, the receiver circuit, that is, the low-noise amplifier LNA of the front end circuit unit, the first differential amplifier LOBUF, the mixer circuit MIX, the second differential amplification circuit AMP, etc., and the signal processing circuit, etc., of the IF band circuit/baseband circuit block are commonly connected to the reference voltage VCC in one stage, making it possible to reduce the required supply voltage. In other words, each transistor configuring these circuits is configured to be in a parallel relationship to the supply voltage in one stage, as described above.

In particular, there are frequent occasions when the mixer circuit MIX needs the supply voltage for operation higher than that of the low-noise amplifier LNA, the local oscillator LO, and the differential amplifiers LOBUF and AMP, which are other circuits in the receiver circuit, and the supply voltage of the entire receiver circuit can be reduced and the power consumption can be drastically reduced by suppressing the supply circuit of the mixer circuit MIX to be low.

Further, according to more preferable embodiment, the front-end circuit can use the bipolar transistor and the IF band circuit/baseband circuit block can use a high-speed MOS transistor, which has a low gate-source breakdown voltage of 1 V or less and a gate length less than 90 nm. According to the present invention, in the semiconductor integrated circuit on which the MMOS transistors and the bipolar transistors are mixed, the supply voltage or the voltage of the signal can be common, making it possible to reduce power consumption due to a voltage level converting circuit.

As such, according to the present invention, the millimeter-wave communication unit including the mixer circuit that is operated at high frequency, low noise, and low power consumption can be provided.

Further, according to use, it is natural that a portion of a circuit configuring the front-end circuit block, for example, the low-noise amplifier LNA may be permitted as a power supply independent from the reference voltage VCC of one stage.

As described above, although the present invention made by the inventors is concretely described based on the embodiments, the present invention is not limited thereto and can be variously changed without departing from the subject of the present invention. For example, the semiconductor integrated circuit having the mixer circuit of the present invention built therein can configure the wireless communication circuit that is not limited to a frequency band of 24 GHz, but can have a lower or higher frequency band by properly selecting an element value. Further, the semiconductor integrated circuit having the mixer circuit of the present invention built therein can be applied to the receiver circuit of the wired communication.

Also, the mixer circuit of the present invention can be applied to various circuits that can be applied by the Gilbert cell type mixer circuit. For example, it can be configured as a frequency divider that reverses the differential output signal, inputs it as the feedback signal to the local oscillator frequency input terminal and outputs a frequency corresponding to ½ of a signal input to the radio frequency input terminal. Further, it can be applied as a multiplier circuit, a demodulator, or a frequency multiplier.

What is claimed is:

1. An active mixer circuit, comprising:
   a voltage-to-current converter;
   a multiplier; and
   a transformer that is connected between the voltage-to-current converter and the multiplier,
   wherein the voltage-to-current converter is configured of one transistor or a plurality of transistors connected in parallel,
   wherein the transformer includes primary winding and secondary winding,
   wherein the voltage-to-current converter is connected in series between a pair of terminals of a reference voltage that supply the supply voltage to the transformer via the primary winding of the transformer,
   wherein a capacitor is disposed between an input terminal of the primary winding of the transformer and a ground terminal which is one of the pair of terminals of the reference voltage,
   wherein an output terminal of the secondary winding of the transformer is connected to the multiplier,
   wherein the primary winding and the secondary winding of the transformer are separated from each other with respect to direct current inside the transformer, and
   wherein a self-inductance value between the input terminal and the ground terminal, and a capacitance value of the capacitor, are both controlled to set a resonant frequency corresponding with a frequency of an input signal.

2. The active mixer circuit according to claim 1,
   wherein the voltage-to-current converter includes an input terminal that receives an input signal of a first frequency, an output terminal that is connected to an input terminal of the primary winding of the transformer, and a ground terminal that is connected to a first reference voltage,
   wherein the terminal of the reference voltage of the input signal of the transformer is connected to a second reference voltage and the output terminal of the transformer is connected to the multiplier, and
   wherein the terminal of the reference voltage of the input signal of the transformer and the terminal of the reference voltage of the output signal of the transformer are separated from each other with respect to direct current inside the transformer.

3. The active mixer circuit according to claim 2,
   wherein the multiplier includes a first input terminal, a second input terminal, a supply voltage terminal, and an output terminal,
   wherein a first node of an end of the primary winding of the transformer is connected to the output terminal of the voltage-to-current converter,
   wherein a second node of the end of the primary winding is connected to a terminal of a second reference voltage VCC1, wherein a first node of an end of the secondary winding of the transformer is connected to the first input terminal of the multiplier, wherein a second node of the end of the secondary winding is connected to a terminal of a reference voltage GND of the transformer, wherein the second input terminal of the multiplier is supplied with the input signal of the second frequency and the supply voltage terminal is connected to a third reference voltage VCC2, and wherein an output signal of a third frequency, which is a difference between the first frequency and the second frequency, is output from the output terminal of the multiplier.

4. The active mixer circuit according to claim 2, wherein the voltage-to-current converter includes a first transistor that configures a transconductance amplifier, wherein a collector or a drain of the first transistor is connected to the first node of the primary winding of the transformer, wherein an emitter or a source of the first transistor is connected to a predetermined second reference voltage GND, wherein the second node of the first primary winding of the transformer is connected to a third reference voltage VCC1, and wherein the intermediate node of the secondary winding of the transformer is connected to the second reference voltage GND.

5. The active mixer circuit according to claim 4, wherein the transistor configuring the multiplier is configured of a plurality of transistors that are connected in parallel between the first node of the secondary winding of the transformer and a fifth reference voltage VCC2.

6. The active mixer circuit according to claim 1, wherein the first node of the end of the primary winding is connected to an input terminal of a single-ended signal of the transformer, wherein the second node of the end of the primary winding is connected to a terminal of a reference voltage of the single-ended input signal of the transformer, wherein the first node of the end of the secondary winding is connected to an output terminal of a differential positive phase signal of the transformer, wherein the second node of the end of the secondary winding is connected to an output terminal of a differential negative phase signal of the transformer, wherein a third node at the middle of the secondary winding is connected to a terminal of a reference voltage of a different output signal of the transformer, and wherein a signal, which is converted from the single-ended signal input to the input terminal of the transformer into the differential signal, is output from a differential output terminal of the transformer.

7. The active mixer circuit according to claim 1, wherein the transformer includes the primary winding, the secondary winding having an intermediate node, a load element, and a capacitor, wherein a first node of the capacitor is connected to an input terminal of a single-ended input signal, wherein a second node of the capacitor, a first node of the load element, and a first node of the primary winding are mutually connected to the single-ended input terminal, wherein a second node of the load element is connected to a terminal of a reference voltage of the single-ended input signal of the transformer, wherein the second node of the end of the primary winding is connected to a terminal of a reference voltage of the differential output signal of the transformer, wherein the first node of the end of the secondary winding is connected to the differential positive phase output terminal of the transformer, wherein the second node of the end of the secondary winding is connected to the differential negative phase output terminal of the transformer, wherein the intermediate node of the secondary winding is connected to the terminal of the reference voltage of the differential signal of the transformer, and wherein a signal, which is converted from the single-ended signal input to the single-ended input terminal of the transformer into the differential signal, is output from the differential output terminal of the transformer.

8. The active mixer circuit according to claim 1, further comprising:

a transconductance amplifier having a first transistor, a transformer, and a multiplier that includes second to fifth transistors, first and second load elements, wherein a first input node RFIN of a base or a gate of the first transistor is connected to a predetermined first reference voltage VRF and is supplied with an input signal of a first frequency, wherein a collector or a drain of the first transistor is connected to the first node of the primary winding of the transformer, wherein an emitter or a source of the first transistor is connected to the predetermined second reference voltage GND, wherein the second node of the primary winding of the transformer is connected to the third reference voltage VCC1, wherein the second input node that mutually connects bases or gates of the second and fifth transistors are connected to a predetermined fourth reference voltage VLO and is supplied with a predetermined positive phase input signal of a second frequency, wherein the third input node that mutually connects bases or gates of the third and fourth transistors are connected to a predetermined fourth reference voltage VLO and is supplied with a predetermined negative phase input signal of the second frequency, wherein emitters or sources of the second and fifth transistors are connected to each other and are connected to the first node of the secondary winding of the transformer, wherein emitters or sources of the third and fourth transistors are connected to each other and are connected to the second node of the secondary winding of the transformer, wherein the intermediate node of the secondary winding of the transformer is connected to the second reference voltage GND, wherein a first load element is connected between the first output node, which mutually connects collectors or drains of the second and third transistors, and the fifth reference voltage VCC2, wherein a second load element is connected between the second output node, which mutually connects collectors or drains of the fourth and fifth transistors, and the fifth reference voltage VCC2, wherein the first output node receives a negative signal of a third frequency, the second output node receives positive signals of the third frequency, whereby the third frequency, which is the output signal, is a difference between the first frequency and the second frequency of the input signals, and wherein the third reference voltage VCC1 of the primary winding of the transformer and the intermediate node GND of the secondary winding of the transformer are separated from each other with respect to direct current inside the transformer.

9. The active mixer circuit according to claim 8,
wherein the voltage, which is a difference between the third reference voltage VCC1 and the second reference voltage GND of the mixer circuit and the voltage, which is a difference between the fifth reference voltage VCC2 and the second reference voltage GND are set to 0.5 V or more to 1.5 V or less.

10. The active mixer circuit according to claim 8, further comprising:
a feedback differential amplifier,
wherein the first output node and a first input node of the feedback differential amplifier are connected to each other and the second output node and a second input node of the feedback differential amplifier are connected to each other.

11. The active mixer circuit according to claim 8, further comprising:
a transconductance amplifier that includes the first transistor and configures the voltage-to-current converter, the transformer, and the multiplier that includes the third to sixth transistors, the first and second load elements, and the feedback differential amplifier,
wherein the second output node of the multiplier and the first input node of the feedback differential amplifier are connected to each other and the first output node of the multiplier and the second input node of the feedback differential amplifier are connected to each other, and
wherein the first output node and the first input node of the feedback differential amplifier are connected to each other via a first feedback resistor and the second output node and the second input node of the feedback differential amplifier are connected to each other via a second feedback resistor.

12. The active mixer circuit according to claim 1,
wherein the voltage-to-current converter includes the transconductance amplifier that is configured of the first and second transistors,
wherein a collector or a drain of the first transistor is connected to the first node of the primary winding of the transformer and a collector or a drain of the second transistor is connected to the second node of the primary winding of the transformer,
wherein the intermediate node of the primary winding of the transformer is connected to the third reference voltage VCC1,
wherein an emitter or a source of the first and second transistor are connected to the predetermined second reference voltage GND, and
wherein the intermediate node of the secondary winding of the transformer is connected to the second reference voltage GND.

13. The active mixer circuit according to claim 1, further comprising:
a transconductance amplifier that includes the first and second transistors and configures the voltage-to-current converter, the transformer, and the multiplier that includes the third to sixth transistors and the first and second load elements, wherein the first input node of the base or gate of the first transistor is connected to the predetermined first reference voltage VRF and is supplied with the positive phase input signal of the first frequency,
wherein the second input node of the base or gate of the second transistor is connected to the predetermined first reference voltage VRF and is supplied with the negative phase input signal of the first frequency,
wherein the collector or the drain of the first transistor is connected to the first node of the primary winding of the transformer and the collector or the drain of the second transistor is connected to the second node of the primary winding of the transformer,
wherein the intermediate node of the primary winding of the transformer is connected to the third reference voltage VCC1,
wherein the emitters and the sources of the first and second transistors are connected to the predetermined second reference voltage GND,
wherein the third input node, which mutually connects the bases or the gates of the third and sixth transistors, is connected to the predetermined fourth reference voltage VLO and is supplied with the positive phase input signal of the second frequency,
wherein the fourth input node, which mutually connects the bases or the gates of the fourth and fifth transistors, is connected to the predetermined fourth reference voltage VLO and is supplied with the negative phase input signal of the second frequency,
wherein the emitters or the sources of the third and sixth transistors are connected to each other and are connected to the first node of the secondary winding of the transformer,
wherein the emitters or the sources of the fourth and fifth transistors are connected to each other and are connected to the second node of the secondary winding of the transformer,
wherein the intermediate node of the secondary winding of the transformer is connected to the second reference voltage GND,
wherein the first load element is connected between the first output node, which mutually connects the collectors or the drains of the third and fourth transistors, and the fifth reference voltage VCC2,
wherein the second load element is connected between the second output node, which mutually connects the collectors or the drains of the fifth and sixth transistors, and the fifth reference voltage VCC2,
wherein the first output node receives the negative phase signal of the third frequency, the second output node receives the positive signal of the third frequency, and the third frequency, which is the output signal, is a difference between the first frequency and the second frequency of the input signals, and
wherein the intermediate node VCC1 of the primary winding of the transformer and the intermediate node GND of the secondary winding of the transformer are separated from each other with respect to direct current inside the transformer.

14. The active mixer circuit according to claim 1,
wherein the transistor is a bipolar transistor.

15. The active mixer circuit according to claim 14,
wherein the transistor is a silicon germanium (SiGe) hetero-junction bipolar transistor.

16. The active mixer circuit according to claim 1, wherein the transistor is a metal-oxide semiconductor (MOS) transistor.

17. A receiver circuit, comprising:
a low-noise amplifier;
an active mixer circuit;
a local oscillator;
a first differential amplifier; and
a second differential amplifier,
wherein the active mixer circuit includes a voltage-to-current converter, a multiplier, and a transformer that is connected between the voltage-to-current converter and the multiplier,
wherein the voltage-to-current converter is configured of one transistor or a plurality of transistors connected in parallel,
wherein the transformer includes primary winding and secondary winding,
wherein the voltage-to-current converter is connected in series between a pair of terminals of a reference voltage that supply the supply voltage to the transformer via the primary winding of the transformer,
wherein a capacitor is disposed between an input terminal of the primary winding of the transformer and a ground terminal which is one of the pair of terminals of the reference voltage,
wherein an output terminal of the secondary winding of the transformer is connected to the multiplier,
wherein the primary winding and the secondary winding of the transformer are separated from each other with respect to direct current inside the transformer, and
wherein a self-inductance value between the input terminal and the ground terminal, and a capacitance value of the capacitor, are both controlled to set a resonant frequency corresponding with a frequency of an input signal.

18. The receiver circuit according to claim 17,
wherein the voltage-to-current converter includes an input terminal that receives an input signal of a first frequency, an output terminal that is connected to an input terminal of the transformer, and a ground terminal that is connected to a first reference voltage,
wherein the terminal of the reference voltage of the input signal of the transformer is connected to a second reference voltage and the output terminal of the transformer is connected to the multiplier,
wherein the voltage-to-current converter is configured of one transistor or a plurality of transistors connected in parallel,
wherein the transistor configuring the multiplier is configured of the plurality of transistors that are connected in parallel between the output terminal of the secondary winding of the transformer and a third reference voltage, and
wherein the terminal of the reference voltage of the input signal of the transformer and the terminal of the reference voltage of the output signal of the transformer are separated from each other with respect to direct current inside the transformer.

19. A millimeter-wave communication unit, comprising:
a front-end circuit block; and
an IF-band circuit/base-band circuit block,
wherein the front-end circuit block includes a low-noise amplifier, an active mixer circuit, a local oscillator, a first differential amplifier, and a second differential amplifier,
wherein the IF-band circuit/base-band circuit block includes a signal processing circuit that demodulates an output signal from the front-end circuit block,
wherein the active mixer circuit includes a voltage-to-current converter, a multiplier, and a transformer that is connected between the voltage-to-current converter and the multiplier,
wherein the voltage-to-current converter is configured of one transistor or a plurality of transistors connected in parallel,
wherein the transformer includes primary winding and secondary winding,
wherein the voltage-to-current converter is connected in series between a pair of terminals of a reference voltage that supply the supply voltage to the transformer via the primary winding of the transformer,
wherein a capacitor is disposed between an input terminal of the primary winding of the transformer and a ground terminal which is one of the pair of terminals of the reference voltage,
wherein an output terminal of the secondary winding of the transformer is connected to the multiplier,
wherein the primary winding and the secondary winding of the transformer are separated from each other with respect to direct current inside the transformer,
wherein a self-inductance value between the input terminal and the ground terminal, and a capacitance value of the capacitor, are both controlled to set a resonant frequency corresponding with a frequency an input signal, and
wherein the low-noise amplifier, the first differential amplifier, the second differential amplifier, and the signal processing circuit of the IF band circuit/baseband circuit are commonly connected to the reference voltage VCC.

20. The millimeter-wave communication unit according to claim 19,
wherein the voltage-to-current amplifier of the active mixer circuit and each transistor configuring the multiplier are configured of a bipolar transistor,
wherein each transistor configuring the signal processing circuit is configured of a MOS transistor, and
wherein the common reference voltage VCC is set to a range of 0.5 or more to 1.5 or less.

* * * * *